(12) United States Patent
Visconti et al.

(10) Patent No.: US 11,721,379 B2
(45) Date of Patent: Aug. 8, 2023

(54) CELL DISTURB ON POWER STATE TRANSITION

(71) Applicant: Micron Technology, Inc., Boise, ID (US)

(72) Inventors: Angelo Visconti, Appiano Gentile (IT); Jahanshir J. Javanifard, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 72 days.

(21) Appl. No.: 17/350,771

(22) Filed: Jun. 17, 2021

(65) Prior Publication Data
US 2022/0406355 A1 Dec. 22, 2022

(51) Int. Cl.
*G11C 11/22* (2006.01)

(52) U.S. Cl.
CPC ........ *G11C 11/2297* (2013.01); *G11C 11/221* (2013.01); *G11C 11/2275* (2013.01)

(58) Field of Classification Search
CPC .......... G11C 11/2297; G11C 11/221; G11C 11/2275
USPC .......................................... 365/145
See application file for complete search history.

(56) References Cited

U.S. PATENT DOCUMENTS

| | | | |
|---|---|---|---|
| 6,587,367 B1 * | 7/2003 | Nishimura | G11C 11/22 365/210.11 |
| 9,922,719 B2 * | 3/2018 | Li | G11C 16/10 |
| 10,229,727 B1 | 3/2019 | Sakurai et al. | |
| 10,622,050 B2 | 4/2020 | El-Mansouri et al. | |
| 2004/0221096 A1 | 11/2004 | Beckert et al. | |
| 2009/0067229 A1 * | 3/2009 | Kang | G11C 13/003 365/171 |
| 2014/0146603 A1 | 5/2014 | Shin et al. | |
| 2014/0304560 A1 | 10/2014 | Narasimha et al. | |
| 2016/0172032 A1 * | 6/2016 | Matsuoka | G11C 13/0026 365/148 |
| 2017/0206010 A1 | 7/2017 | Nachimuthu et al. | |
| 2018/0107417 A1 | 4/2018 | Shechter et al. | |

FOREIGN PATENT DOCUMENTS

KR 10-2014-0066391 A 6/2014

OTHER PUBLICATIONS

"International Search Report and Written Opinion of the International Searching Authority," issued in connection with Int'l Appl. No. PCT/US2022/072807, dated Sep. 27, 2022 (11 pages).

* cited by examiner

*Primary Examiner* — Connie C Yoha
(74) *Attorney, Agent, or Firm* — Holland & Hart LLP

(57) ABSTRACT

Methods, systems, and devices for cell data bulk reset are described. In some examples, a write pulse may be applied to one or more memory cells based on an associated memory device transitioning power states. To apply the wire pulse, a first subset of digit lines may be driven to a first voltage and a plate may be driven to a second voltage or a third voltage. While the digit lines and plate are driven to the respective voltages, one or more word lines may be driven to the second voltage or the third voltage. In some instances, the digit lines may be selected (e.g., driven) according to a pattern.

25 Claims, 11 Drawing Sheets

CELL DISTURB ON POWER STATE TRANSITION

FIELD OF TECHNOLOGY

The following relates generally to one or more systems for memory and more specifically to cell data bulk reset.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
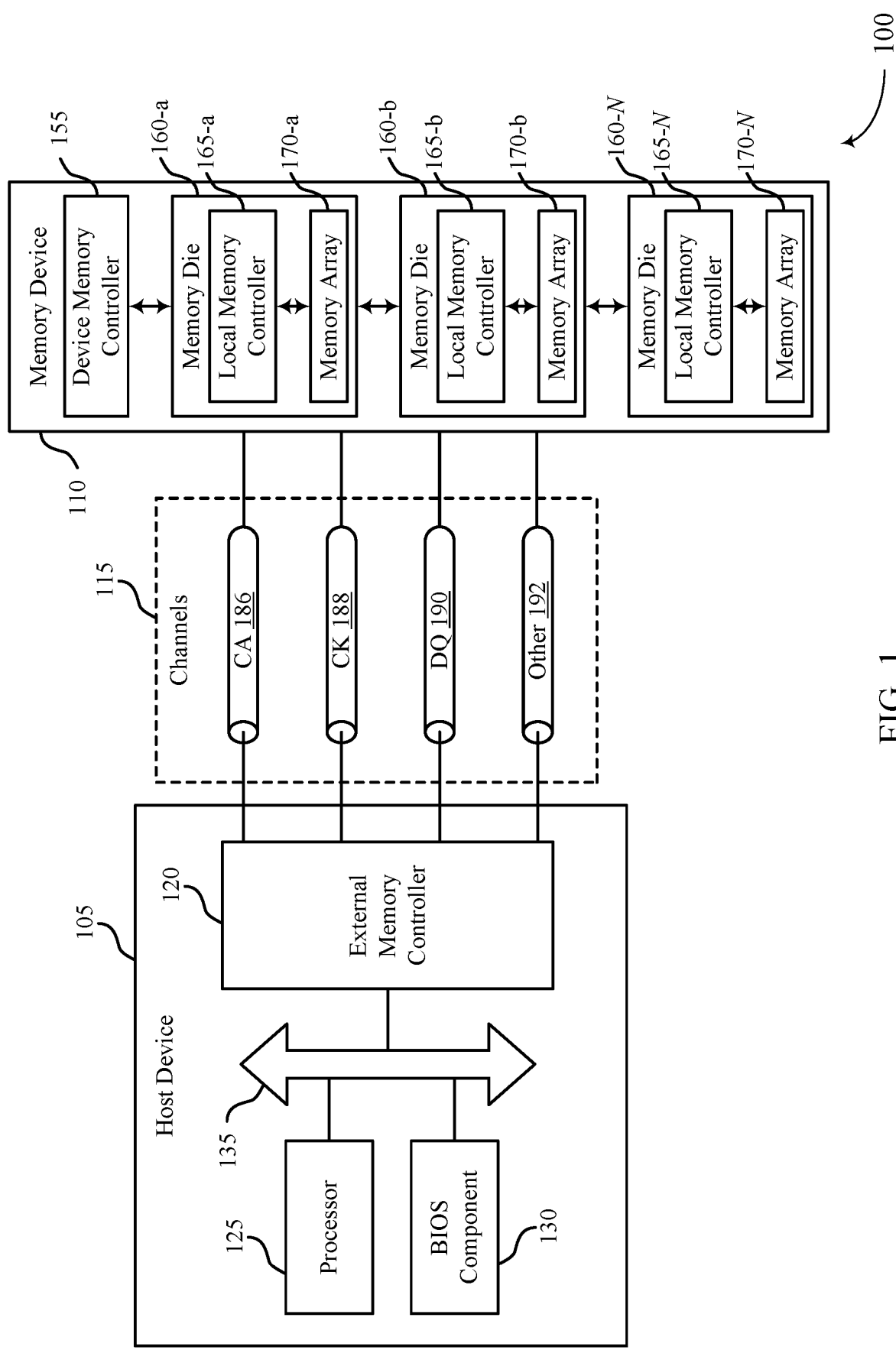
FIG. 1 illustrates an example of a system that supports cell data bulk reset in accordance with examples as disclosed herein.

Electronic devices, such as memory devices, may include memory such as dynamic random-access memory (DRAM). Because DRAM (and other similar memory types) is volatile in nature, it may store data only during the time it is powered up (e.g., or for only a short transient time after). In other words, volatile memory requires power to maintain stored information. In some memory devices, non-volatile memory may be a suitable replacement for DRAM. However, because non-volatile memory does not require power to maintain stored data, the data may be susceptible to being accessed even after the memory device has been powered off. That is, because a memory system may be configured to utilize volatile memory and may not have security practices in place for data retained in the memory after power is removed, replacing the volatile memory with non-volatile memory may pose security threats. Thus, use of non-volatile memory as a replacement for volatile memory may present challenges.

A memory system configured to perform a bulk reset on one or more non-volatile memory cells upon transitioning power states is described herein. In some examples, when a memory system powers off (or on), some data may be reset (e.g., reprogrammed) to minimize security risks that would otherwise arise due to the non-volatile nature of the memory. In a first example, a write pulse may be applied to a set of memory cells, which may affect the distribution of a subset of the memory cells having been previously programmed to a second logic state (e.g., a logic "1"). To apply the write pulse to the set of memory cells, one or more digit lines may be driven to a first voltage (e.g., VSS), a plate line may be driven to a third voltage (e.g., VDD2), and one or more word lines associated with the set of memory cells may be driven to a second voltage (e.g., VDD1). In some instances, the plate may be driven to VDD1 or the word lines may be driven to VDD2. Accordingly, a write pulse may be applied to the set of memory cells, which may affect a distribution of a subset of the cells having previously been programmed to a logic "1" state. In some instances, a power savings may be incurred due to driving the plate to a different (e.g., a lower) voltage than the word lines. Moreover, performing a bulk reset on one or more non-volatile memory cells upon a memory system transitioning power states may mitigate security risks that the memory system may otherwise be susceptible to when transitioning power states.

Additionally or alternatively, the digit lines selected (e.g., driven) during a force write operation may be selectable. For example, a memory device may include instructions (either hardcoded or received from a host device) as to which digit lines to drive to a voltage during a bulk reset operation. To program a subset of memory cells, a pattern of digit lines may be selected (e.g., driven) and a corresponding plate line and word line group may be driven to respective voltage values to write a first logic state or a second logic state to the corresponding memory cells. In some instances, the pattern of digit lines may be selected as to write a first logic state to a subset of memory cells, a second logic state to the subset of memory cells, or a logic state to alternating rows of memory cells. Writing different logic states to a pattern of memory cells during a force write operation may mitigate any security risks that the memory system may otherwise be susceptible to when transitioning power states.

Figure 2:
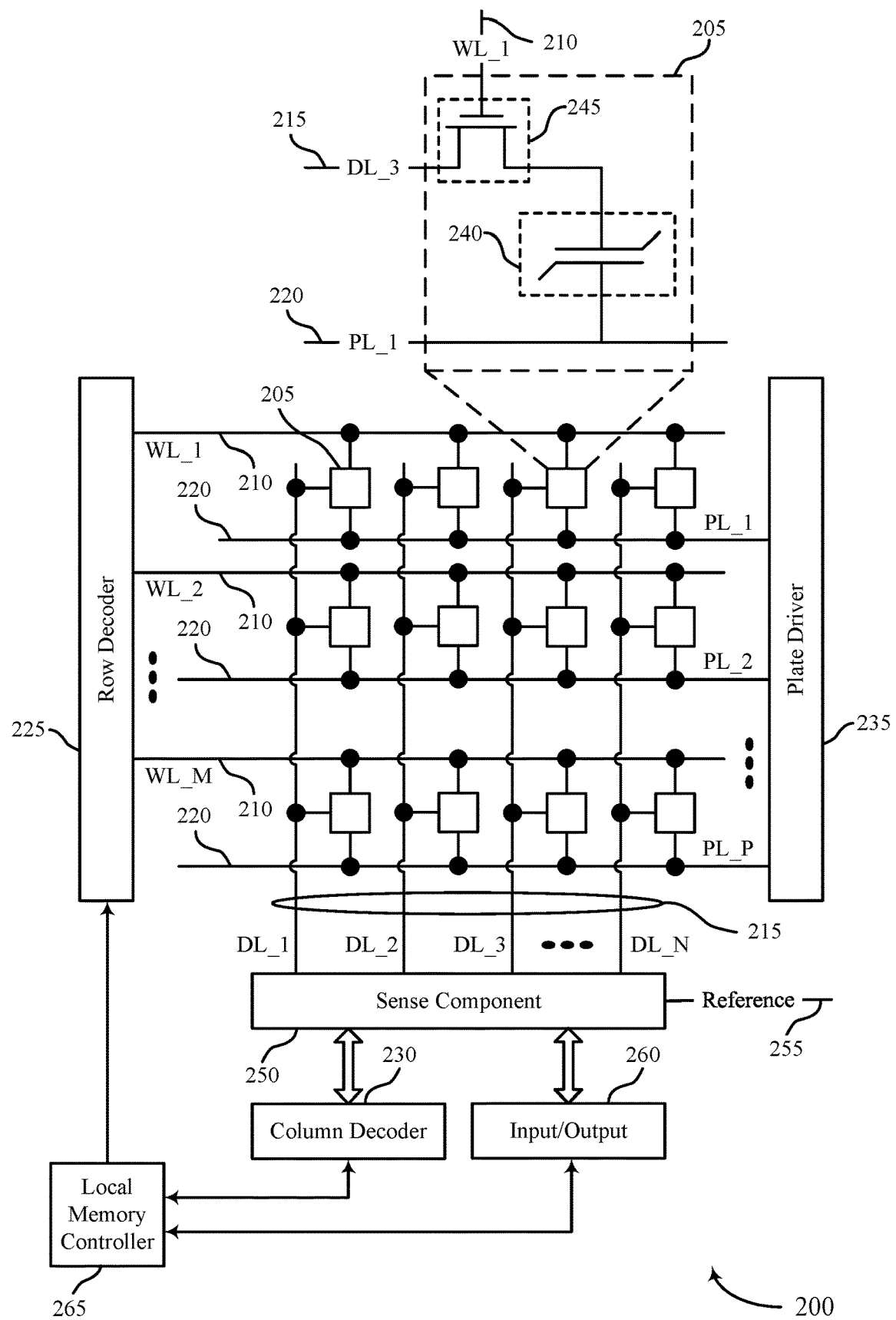
FIG. 2 illustrates an example of a memory die that supports cell data bulk reset in accordance with examples as disclosed herein.

Features of the disclosure are initially described in the context of systems and dies with reference to FIGS. 1 and 2. Features of the disclosure are described in the context of circuit diagrams, timing diagrams, a plot, and a block diagram with reference to FIGS. 3-7. These and other features of the disclosure are further illustrated by and described with reference to an apparatus diagram and flowcharts that relate to cell data bulk reset as described with reference to FIGS. 9-11.

FIG. 1 illustrates an example of a system 100 that supports cell data bulk reset in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 *a*, memory die 160 *b*, memory die 160 N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, a bulk reset operation may be performed on one or more memory cells of the memory arrays 170. For example, the memory device 110 may receive a command or signaling (e.g., from the host device 105) to transition from a first power state to a second power state. Upon receiving the command or signaling, a local memory controller 165 may initiate driving one or more digit lines of a memory array 170 to a first voltage (e.g., to VSS, to ground) and one or more plate lines to a second voltage (e.g., to VDD1) or a third voltage (e.g., to VDD2). Moreover, the local memory controller 165 may assert a group of word lines (e.g., drive one or more word lines to the second voltage or the third voltage), which may result in a positive write pulse being applied, which may disturb the logic state written to some memory cells. That is, if the memory cell was already in the first logic state it may remain in the first logic state, and if the memory cell was in the second logic state its distribution may be disturbed. Because the memory cells of the memory device 110 may be non-volatile memory cells and thus may retain data when powered off, performing a bulk reset operation on the memory cells may prevent valid data from being stored when transitioning power states, which may otherwise pose a security risk to the memory device 110. The force write operation may be performed on power down (e.g., when an indication that power will be removed is received, or when power is removed), on power up (e.g., upon detecting power being supplied after being powered down), or on both power down and power up.

FIG. 2 illustrates an example of a memory die 200 that supports cell data bulk reset in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, or logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

In some examples, a bulk reset operation may be performed on one or more memory cells 205 of the memory die 200. For example, the local memory controller 265 may receive a command (e.g., from the host device 105 as described with reference to FIG. 1) or signaling (e.g., a change in condition of a power supply) to transition from a first power state to a second power state. Upon receiving the command or signaling, the local memory controller 265 may initiate driving one or more digit lines 215 to a first voltage (e.g., VSS) and driving one or more plate lines 220 to a second voltage (e.g., VDD1) or a third voltage (e.g., VDD2). Moreover, the local memory controller 265 may assert a group of word lines 210 (e.g., drive one or more word lines 210 to the second voltage or the third voltage), which may result in a positive write pulse being applied, which may disturb the logic state written to some memory cells 205. Because the memory cells 205 of the memory die 200 may be non-volatile memory cells and thus may retain data when powered off, performing a bulk reset operation on the memory cells 205 may prevent valid data from being stored when transitioning power states, which may otherwise pose a security risk for data stored by the host device.

Figure 3:
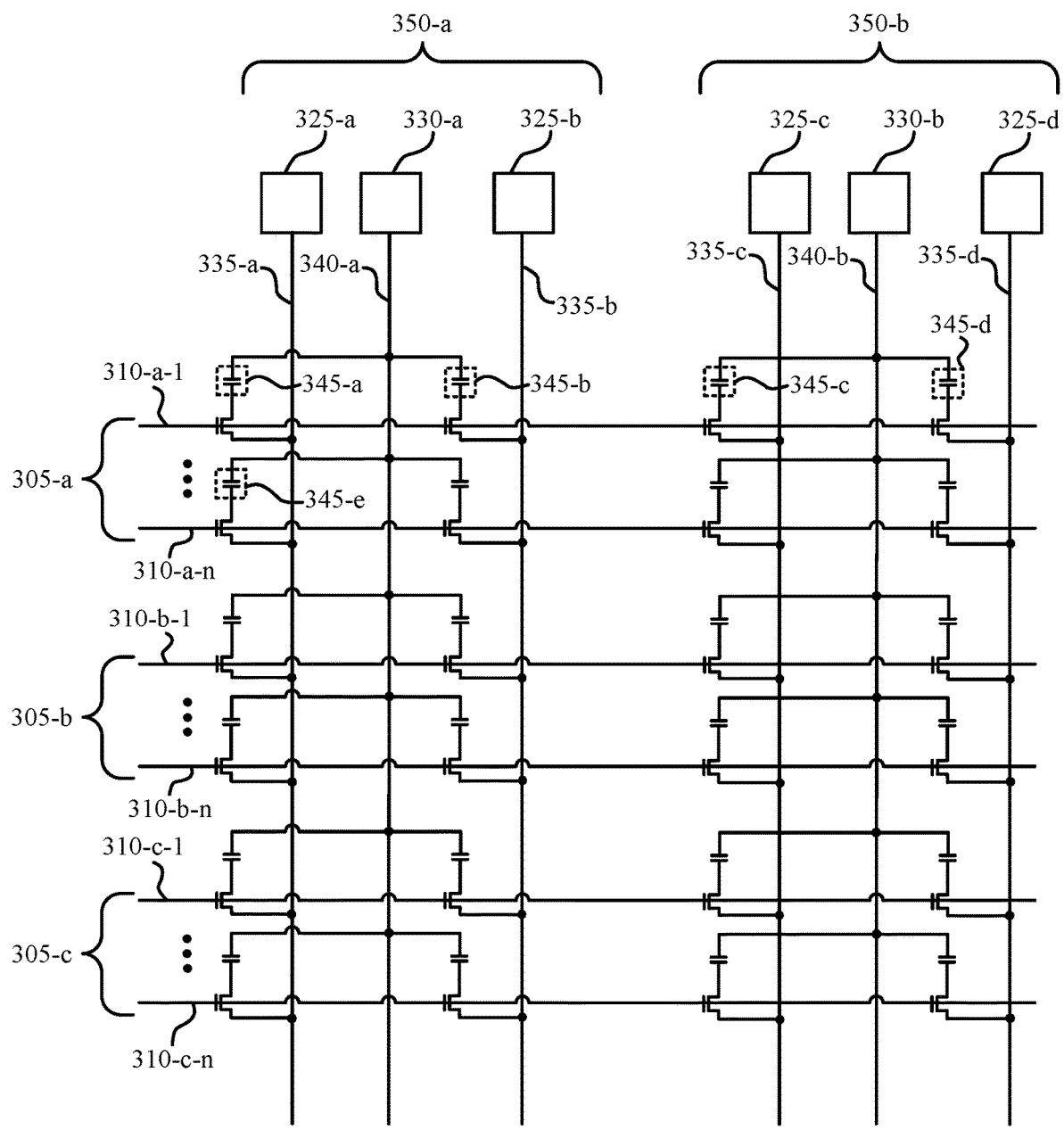
FIG. 3 illustrates an example of a circuit diagram that supports cell data bulk reset in accordance with examples as disclosed herein.

FIG. 3 illustrates an example of a circuit diagram 300 that supports cell data bulk reset in accordance with examples as disclosed herein. The circuit diagram 300 may illustrate aspects of an array of non-volatile memory cells 345. For example, the circuit diagram 300 may illustrate non-volatile memory cells 345 that are each coupled with a word line of a respective word line group 305, digit lines 335, and plate lines 340. The circuit diagram 300 may also illustrate drivers 325, which may be coupled with the digit lines 335, and drivers 330, which may be coupled with the plate lines 340. The word lines 310 of each word line group 305 may also be coupled with one or more drivers (not shown).

Each driver may be coupled with one or more voltage sources and may be configured to drive a respective line (e.g., a digit line 335, a plate line 340, or a word line 310) based on a voltage source coupled with the driver. For example, drivers may be coupled with a first voltage source (e.g., VSS), a second voltage source (e.g., VDD1), a third voltage source (e.g., VDD2), or a fourth voltage source (e.g., VMPL). In some instances, either an access operation (e.g., a write operation, a read operation) or a force write operation (e.g., a bulk reset operation) may be performed on memory cells 345 based on the drivers driving respective lines to respective voltages.

The circuit diagram 300 may support bulk reset operations, where a logic state programmed to some memory cells 345 (e.g., memory cells 345 having been previously programmed to a logic "1" state) is disturbed upon an associated memory device transitioning power states. For example, a write pulse may be applied to a subset of memory cells 345 upon the memory device powering on or powering off. Because the memory cells 345 may be non-volatile memory cells and be configured to store data when powered off, performing a bulk reset operation to disturb the logic state stored to some of the memory cells may reduce the likelihood of security threats to an associated memory device due to otherwise valid data being present subsequent to a power off event.

The circuit diagram may illustrate an array of non-volatile memory cells 345. In some examples, each memory cell 345 may be coupled with a word line 310 of a word line group 305. For example, the first word line group 305-a may include word lines 310-a-1 through 310-a-n, where n represents a positive integer. Each word line 310-a may be coupled with a respective word line driver (not shown). The word line drivers may be configured to drive the word lines 310-a to a first voltage (e.g., VSS or 0V) when the word lines 310-a are not selected, or to a second voltage (e.g., VDD1) or a third voltage (e.g., VDD2) when the word lines 310-a are selected (e.g., based on a row decoder such as row decoder 225).

In some instances, each word line group 305 may be configured similarly. For example, the second word line group 305-b may include word lines 310-b-1 through 310-b-n and the third word line group 305-c may include word lines 310-c-1 through 310-c-n, where n represents a positive integer. Each word line 310-b may be coupled with a driver (e.g., a respective driver). During an access operation (e.g., a normal write operation), a single word line 310 of a word line group 305 may be selected at a time. Conversely, during a bulk reset operation (e.g., during a force write operation), an entire word line group 305 may be selected at a time. For example, the word lines 310-a of the first word line group 305-a may be selected by a row decoder (e.g., by a row decoder 225 as described with reference to FIG. 2) while the word lines 310-b of the second word line group 305-b and the word lines 310-c of the third word line group 305-c are unselected. Thus, during a force write operation, one or more word lines 310-a may be driven to a second voltage (e.g., VDD1) or a third voltage (e.g., VDD2), while the word lines of the second word line group 305-b and the third word line group 305-c are unselected.

The memory cells 345 of each word line group 305 may be coupled with one or more digit lines 335. For example, the digit line 335-a may be coupled with memory cells 345 (e.g., a subset of memory cells 345) from each word line group 305. That is, the digit line 335-a may be coupled with a memory cell 345 located at the intersection of each word line of each word line group 305. Similarly, the digit line 335-b may be coupled with a memory cell 345 located at the intersection of each word line of each word line group 305. In some instances, the digit line 335-a and the digit line 335-b may be coupled with the drivers 325-a and 325-b, respectively. The drivers 325-a and 325-b may be coupled with at least a first voltage source and may be configured to apply one of a plurality of voltages (e.g., VSS, VDD1) to the digit lines 335-a and 335-b. For example, the drivers 325 may each be configured to apply a first voltage (e.g., VSS) to the digit lines 335 during a bulk reset operation. The digit lines 335 may also be coupled with sense amplifiers (not shown) for sensing logic values of the memory cells 345 for read operations.

The memory cells 345 of each word line group 305 may be coupled with at least one plate line 340 from a plate group 350. For example, the memory cells 345-a and 345-b may be coupled with a plate line 340-a from the plate group 350-a (e.g., the plate line 340-a may be coupled with a first plate). Similarly, the memory cells 345-c and 345-d may be coupled with a plate line 340-b from the plate group 350-b (e.g., the plate line 340-b may be coupled with a second plate). In some instances, the plate line 340-a and the plate line 340-b may be coupled with drivers 330-a and 330-b, respectively.

During a standard write operation, the drivers 330-a and 330-b may couple the plate lines 340-a and 340-b with a voltage source (e.g., VMPL) for programming memory cells 345 to a first logic state (e.g., a logic "0"). Moreover, the drivers 330-a and 330-b may couple the plate lines 340-a and 340-b with a different voltage source (e.g., VSS) for programming memory cells 345 to a second logic state (e.g., a logic "1"). As described herein, VMPL may be a same or a different voltage as VDD1 and VDD2. VMPL may be higher than a voltage supply to the memory device (e.g., VDD1 or VDD2) and may be generated by the memory device from one of the voltage supplies. In the instances where VMPL is a different voltage than VDD1 and VDD2, during a bulk reset operation the drivers 330-a and 330-b may couple the plate lines 340-a and 340-b to VDD1 or VDD2 as these voltage sources may have a greater ability to provide charge when a power source is removed from the associated memory device. That is, coupling the plate lines 340-a and 340-b to VDD1 or VDD2 may allow the associated memory device to perform a force write operation using the charge remaining on the capacitors of VDD1 or VDD2.

During a bulk reset operation, the drivers 330-a and 330-b may couple the plate lines 340-a and 340-b with a second voltage (e.g., VDD1) or a third voltage (e.g., VDD2). For example, during the bulk reset operation, the drivers 330 may each be configured to apply a second voltage (e.g., VMPL) or a third voltage (e.g., VDD2) to the plate lines 340. In some instances, VDD1 and VMPL may each be referred to as a "second voltage" and thus may each represent a same or similar voltage applied to the word lines and plate lines 340. During other operations, such as an access operation, the drivers 330-a and 330-b may couple the plate lines 340-a and 340-b with a different voltage source, such as VMPL as described above.

In some examples, a "strong disturb" pulse may be applied to one or more memory cells during a force write operation. For example, the plate line 340-a may be driven to VDD2 (e.g., which may be a lower voltage than VDD1 or VMPL used for programming cells during a normal write operation), the digit lines 335-a and 335-b may be driven to VSS, and the word lines 310-a may be asserted. In some cases, the word lines 310-a may be driven to a lower voltage than the voltage used during a normal write operation. For example, the word lines 310-a may be driven to VDD1 or a higher voltage (e.g., VCCP which may be a voltage generated on the memory device from VDD1) during a normal write operation, and may be driven to VDD1 or VDD2 during the force write operation, where VDD2 may be a lower voltage than VCCP or VDD1. Driving the lines to such voltages may apply a pulse to the memory cells 345 that may "disturb" the distribution of memory cells 345 having been previously written to a logic "1" state. Thus, the distribution of a subset of the memory cells 345 may be affected, and thus may be associated with a distribution between a logic "0" and a logic "1" state. Performing the force write operation to affect the distribution of a subset of memory cells may create uncertainty of the codeword that is produced during an error correction procedure, which may effectively reduce the likelihood of security threats to data stored by an associated memory device due to sensitive data being present subsequent to a power off event.

In some instances, the third voltage VDD2 may also be applied to one or more word lines 310 of a word line group 305 during a force write operation. Additionally or alternatively, the second voltage VDD1 may be applied to a plate line 340 during a force write operation. As described herein, the associated memory device may include at least two power supplies (e.g., VDD1 and VDD2). During an access operation (e.g., a normal write operation), a voltage of VDD1 or higher (e.g., VMPL) may be applied to the plate lines 340, word lines 310, or both. Conversely, when the memory device transitions power states (e.g., when the memory device powers off or on), either VDD1 or VDD2 may be applied to the plate lines 340, word lines 310, or both.

Whether VDD1 or VDD2 is applied to the plate lines 340 or word lines 310 may depend upon an available power supply. For example, either VDD1 or VDD2 may lose power before the other. Although it may be beneficial to apply VDD2 to a plate line 340, a word line 310, or both for power savings purposes, VDD2 may lose power before VDD1 in some instances. Accordingly, the circuit 300 may include comparators or other logic (e.g., OR gates, diodes) that is configured to switch the power supply provided to the plate line 340, the word lines 310, or both when a power supply becomes critically low.

During a standard write operation, different voltages may be applied to the word lines, digit lines 335, and plate lines 340. For example, to write a logic "0" to the memory cell 345-a a positive voltage (e.g., VMPL) may be applied to the plate line 340-a and the digit line 335-a may be grounded. While the positive voltage is applied to the plate line 340-a and while the digit line 335-a is grounded, the word line 310-a-1 may be asserted, which may result in a positive write pulse across the memory cell 345-a.

To write a logic "1" to the memory cell, a positive voltage (e.g., VDD1) may be applied to the digit line 335-a and the plate line 340-a may be grounded. While the positive voltage is applied to the digit line 335-a and while the plate line 340-a is grounded, the word line 310-a-1 may be asserted, which may result in a negative write pulse across the memory cell 345-a. Although a first voltage (e.g., VSS, ground) is described as being applied to the plate lines 340 or the digit lines 335 during a write operation, a different voltage may be applied to write a logic "1" or a logic "0" to a memory cell 345. For example, a logic "0" may be written to a memory cell 345 by applying a write pulse having a positive polarity and a logic "1" may be written to a memory cell 345 by applying a write pulse having a negative polarity. That is, a logic "0" may be written to a memory cell 345 when a voltage of a plate line 340 is greater than (e.g., by more than a threshold) a voltage of a digit line 335 associated with the memory cell 345, and a logic "1" may be written to a memory cell 345 when a voltage of the plate line 340 is less than (e.g., by more than a threshold) a voltage of a digit line 335 associated with the memory cell 345.

In some instances, however, it may be desirable to perform a force write operation on some memory cells, such as the memory cell 345-a. For example, a force write operation may be performed on one or more memory cells 345, and the memory cells 345 having previously stored a logic "1" state may be reset (e.g., based on the voltages applied to the word lines 310, digit lines 335, and plate lines 340). As described herein, it may be desirable to reset some memory cells 345 upon an associated memory device transitioning power states (e.g., powering on or powering off).

To perform a force write operation, a write pulse may be applied to some memory cells 345 by grounding one or more digit lines 335 while driving a plate line 340 and one or more word lines to a same voltage value. For example, to perform a force write operation on the memory cell 345-a, the digit line 335-a may be grounded (e.g., a first voltage (VSS) may be applied to the digit line 335-a) and the plate line 340-a may be driven to a third voltage (e.g., VDD2). The word line 310-a-a may then be asserted (e.g., the word line 310-a-a may be driven to VDD1), and a write pulse may be applied to the memory cell 345-a, which may affect the distribution of the memory cell 345-a. In some cases, the voltage used to assert the word lines may be lower than VDD1 (e.g., VDD2) during the force write operation because the digit lines 335 are grounded and thus the word lines may activate the selection transistors to pull the node on the memory cells coupled with the selection transistors to ground with a relatively low voltage (e.g., a threshold voltage of the selection transistors or greater).

In some examples, it may be desirable to force write (e.g., apply a strong disturb pulse) to enough memory cells as to disrupt an error correction operation (e.g., an error correcting code (ECC) operation). ECC operations may be performed on a word line basis, thus applying a strong disturb pulse to at least a subset of memory cells 345 of each word line 310 may effectively reset enough memory cells as to disrupt the ECC operation, which may reduce the likelihood of security threats to data stored by the memory device due to sensitive data being present subsequent to a power off event. For example, an ECC may be performed on data stored in the memory cells 345 that may be able to correct K bit errors per codeword, where one codeword may be stored per row of memory cells 345. Thus, to disrupt the ECC, at least a threshold (e.g., 2K+1, 3K, 4K) of memory cells 345 from each row may be programmed during the bulk reset to disrupt the ECC for at least most or almost all codewords. Once more than K bit errors are introduced by the bulk reset operation, the ECC may introduce additional bit errors, making the original data unrecoverable. In some cases, the ECC used may be a non-systematic code (e.g., the codeword does not contain the input symbols), which may reduce the likelihood of recovering any portions of the original data after the bulk reset operation.

To apply a strong disturb pulse to a subset of memory cells 345 of each word line 310, each word line 310-a of the word line group 305-a may be selected during a same duration, and one or more digit lines 335 may be grounded, while a corresponding plate line 340 is driven to a higher voltage than the digit lines 335. Accordingly, multiple memory cells 345 may be disturbed during a single bulk reset operation.

Additionally or alternatively, other memory cells (such as the memory cells associated with the second plate group 350-b) may be disturbed during a subsequent duration. For example, each word line group 305 may be asserted sequentially while a subset of digit lines 335 is driven to VSS and another subset of digit lines 335 is driven to VDD1. Asserting the word lines 310 of each word line group 305 may result in a subset of memory cells 345 coupled with each word line 310 being programmed. In some examples, a force write operation as described herein may be a same or different operation on power down and power up. For example, on power down, memory cells 345 associated with a first plate group 350-a may be programmed, and on power up the memory cells 345 of the first plate group 350-a or the second plate group 350-b may be programmed. Utilizing different operations on power down and power up may allow for a subset of memory cells 345 of each word line 310 to be programmed in case the force write operation is not finished when the memory device powers down, while offering further protection if the force write operation performed when the memory device powers down does complete. When the force write operation is performed on power up, the memory device may lock up access to the memory cells until the force write operation is complete. Accordingly, performing a bulk reset operation on a subset of memory cells 345 may reduce the likelihood of security threats to data stored by an associated memory device due to sensitive data being present subsequent to a power off event.

Figure 4:
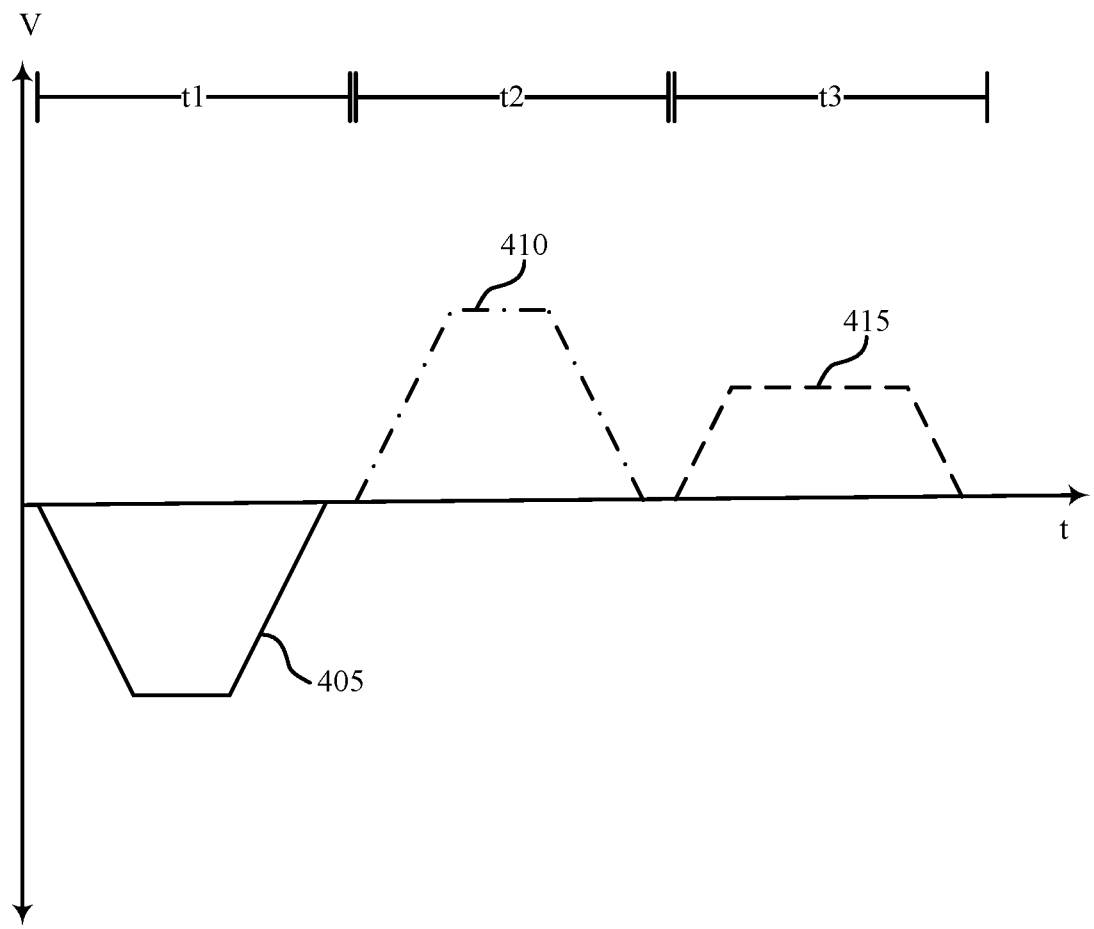
FIG. 4 illustrates an example of a timing diagram that supports cell data bulk reset in accordance with examples as disclosed herein.

FIG. 4 illustrates an example of a timing diagram 400 that supports cell data bulk reset in accordance with examples as disclosed herein. In some examples, the timing diagram 400 may illustrate the pulses (e.g., write pulses) applied to a first memory cell and a second memory cell during a write operation (e.g., a normal write operation) and a force write operation. For example, the timing diagram 400 may illustrate a write operation performed on a first memory cell (e.g., a memory cell 345-a as described with reference to FIG. 3), a second memory cell (e.g., a memory cell 345-b as described with reference to FIG. 3), followed by a force write operation performed on a subset of memory cells that includes at least the first memory cell and the second memory cell. The force write operation may illustrate a write pulse being applied to a memory cell, which may affect the cell's distribution upon an associated memory device transitioning power states. For example, the write pulse may be applied to the subset of memory cells 345 upon the memory device powering on or powering off. Because the memory cells 345 may be non-volatile memory cells and be configured to store data when powered off, performing a bulk reset operation on the memory cells 345 may reduce the likelihood of security threats to data stored by an associated memory device due to sensitive data being present subsequent to a power off event.

For exemplary purposes only, the timing diagram 400 may illustrate a write operation performed on a memory cell 345-a, followed by a write operation performed on a second memory cell 345-b as described with reference to FIG. 3. That is, during intervals t1 and t2, a normal write operation (e.g., a write operation resulting from receiving a command to perform a write operation on memory cells associated with the word line 310-a-1) may be performed. The normal write operation that occurs during intervals t1 and t2 may be followed by a force write operation, during t3, that is performed on a subset of memory cells that includes at least the first memory cell 345-a and the second memory cell 345-b. As described herein, write operations and force write operations may be performed on a subset of memory cells of a memory array. For example, as described with reference to FIG. 3, write operations and force write operations may be performed (e.g., performed sequentially or simultaneously) on the memory cells of one or more word line groups 305 or one or more plate groups 350 during an interval. Thus, during the intervals t1, t2, and t3 a write operation or force write operation may be performed on multiple memory cells (e.g., multiple memory cells of a subset of memory cells) sequentially or simultaneously.

During t1, a negative write pulse 405 may be applied to the memory cell 345-a, which may result in a logic "1" being written to the memory cell 345-a. The negative write pulse 405 may be applied by applying a positive voltage (e.g., VDD) to the digit line 335-a and the plate line may be grounded. While the positive voltage is applied to the digit line 335-a and while the plate line 340-a is grounded, the word line 310-a-1 may be asserted, which may result in a negative write pulse across the memory cell 345-a.

In some instances, the negative write pulse 405 may be applied to one or more memory cells sequentially or simultaneously (e.g., during t1). For example, the first memory cell 345-a may be written to a logic "1" during t1. To write the memory cell 345-a, a positive voltage may be applied to the digit line 335 and the plate line 340-a may be driven to a low voltage (e.g., VSS, a voltage lower than VSS). Moreover, the word line 310-a-1 may be asserted, which may result in the negative write pulse 405 being applied to the memory cell 345-a. While the memory cell 345-a is being written, word lines 310 that are not asserted may be grounded (e.g., driven to the first voltage (VSS)).

During t2, a positive write pulse 410 may be applied to the memory cell 345-*b*. Applying the positive write pulse 410 to the memory cell 345-*b* may result in a logic "0" being written to the memory cell 345-*b*. The positive write pulse 410 may be applied by applying a positive voltage (e.g., VMPL) to the plate line 340-*a* and the digit line 335-*a* may be grounded. While the positive voltage is applied to the plate line 340-*a* and while the digit line 335-*a* is grounded, the word line 310-*a*-1 may be asserted, which may result in a positive write pulse across the memory cell 345-*b*.

In some instances, the negative write pulse 405 and positive write pulse 410 may each be applied to multiple memory cells simultaneously (e.g., within the durations t1 and t2). For example, multiple memory cells 345 associated with the first word line 310-*a*-1 may be written to a logic "1" during t1, followed by multiple memory cells 345 associated with the first word line 310-*a*-1 being written to a logic "0" during t2.

After a logic state is written to one or more memory cells 345 during t1 and t2, the memory device may transition power states. For example, the memory device may receive a command or signaling (e.g., from a host device, a local controller, or the like) to power off. Thus, during t3, the memory device may perform a force write operation on one or more memory cells before the associated memory device powers off. Although the following example is described as occurring before an associated memory device powers off, in some examples a force write operation may occur upon an associated memory device powering on (that is, t3 may occur after power on).

During t3, a force write operation may occur on one or more memory cells, such as the memory cell 345-*a*, 345-*b*, and 345-*e*, to disturb at least a portion of the memory cells. For example, the force write operation may change the distribution of memory cells having been previously programmed to a logic "1" state. That is, the force write pulse may be applied to each of the set of memory cells, and the distribution of the memory cells that have previously been programmed to a logic "1" may be altered (e.g., disturbed), while the distribution of memory cells that have been programmed to the logic "0" state may remain substantially unchanged. To perform a force write operation, a positive write pulse 415 may be applied to the memory cells 345-*a*, 345-*b*, and 345-*e*, which may result in the distribution of the memory cells changing. In some examples, as described herein, the positive write pulse 405 may be applied to a subset of memory cells 345 associated with word lines 310 of the first word line group 305-*a*. For example, the positive write pulse 405 may be applied by grounding the digit lines 335-*a* and 335-*b* and driving the plate line 340-*a* to a third voltage (e.g., VDD2). While the plate line 340-*a* is driven to the third voltage and while the digit lines 335-*a* and 335-*b* are grounded, the word lines 310-*a* may be asserted (e.g., the word lines 310-*a* may be driven to the second voltage (VDD1)).

In some cases, memory cells 345-*a* and 345-*e* may have previously been written to a logic "1" state while memory cell 345-*b* may have previously been written to a logic "0" state. Thus, the distribution of the memory cells 345-*a* and 345-*e* may be altered by the positive write pulse 405, while memory cell 345-*b* remains programmed to the logic "0" (e.g., the positive write pulse 405 may not change the state of memory cell 345-*b*). The force write operation may reduce the likelihood of security threats to data stored by an associated memory device due to sensitive data being present subsequent to a power off event.

In some instances, driving the plate line 340-*a* to a third voltage may result in a "strong disturb" bias being applied to the memory cells 345-*a* and 345-*e*. Applying a strong disturb bias to the memory cells may result in the memory cells having a different distribution than the distribution of a traditional logic "0" or logic "1" state. That is, the strong disturb bias may "disturb" the distribution of memory cells having previously been programmed to a logic "1" state. Disturbing the distribution of these cells may effectively reset the memory cells such that previously stored data may not be accessed when the associated memory device is powered off. Moreover, because VDD2 may be a lower voltage than VDD1 (e.g., VDD2 may be 1.0V and VDD1 may be 1.8V), applying a strong disturb bias may reduce the overall power consumption of the associated memory device while still reducing the likelihood of security threats to data stored by an associated memory device due to sensitive data being present subsequent to a power off event.

The positive write pulse 415 (e.g., the force write pulse 415) may be applied to a subset of memory cells associated with the first word line group 305-*a*. For example, a first portion of memory cells 345 associated with the first word line group 305-*a* may be written (e.g., force written) during t3 while a second portion of memory cells 345 associated with the first word line group 305-*a* may not be written. To force write the first portion of memory cells 345, one or more digit lines 335 associated with the plate group 350-*a* may be grounded and the plate line 340-*a* may be driven to VDD2. In contrast, the digit lines 335 associated with the plate group 350-*b* may be driven to a same voltage as the plate line 340-*b* (e.g., VSS, VDD1, or VDD2). Thus, when the word lines 310-*a* are asserted, the positive write pulse 415 may be applied to the memory cells 345 associated with the first word line group 305-*a* and the first plate group 350-*a* while no write pulse is applied to the memory cells 345 associated with the first word line group 305-*a* and the second plate group 350-*b*. While the memory cells 345 of the first word line group 305-*a* are being force written, the word lines associated with the second word line group 305-*b* and the third word line group 305-*c* may be unselected.

In some examples, it may be beneficial to program a subset of the memory cells 345 associated with the first plate group 350-*a* by sequentially performing a force write on the word line groups 305-*a* through 305-*c* while the digit lines 335-*c* and 335-d are at a same voltage as the plate line 340-*b*. For example, because programming memory cells 345 utilizes current, it may be beneficial to minimize the amount of current utilized after power is removed from the memory device. Limiting the current draw in any one force write operation may allow for multiple operations (e.g., multiple force write operations) to be performed sequentially without having a relatively high power draw.

In some instances, after writing or force writing the memory cells associated with the first word line group 305-*a* and the first plate group 350-*a*, memory cells associated with the second plate group 350-*b* or the second word line group 305-*b* may be written or force written. That is, to write or force write the memory cells associated with the second plate group 350-*b*, the plate line 340-*b* and associated digit lines 335 may be driven to respective values and the word lines 310 may be asserted to write (or force write) one or more memory cells.

Additionally or alternatively, to write or force write the memory cells associated with the second word line group 305-*b*, the plate line 340-*a* and associated digit lines 335 may be driven to respective values and the word lines 315 may be asserted to write (or force write) one or more memory cells. Although a finite quantity of word line groups 305 and plate groups 350 are illustrated and described herein, a memory device may include any quantity of word line groups 305 and plate groups, and thus a force write operation may be performed on any quantity of word line groups 305 and plate groups 350. Performing a force write operation upon an associated memory device transitioning power states, as described herein, may reduce the likelihood of security threats to data stored by an associated memory device due to sensitive data being present subsequent to a power off event.

Figure 5:
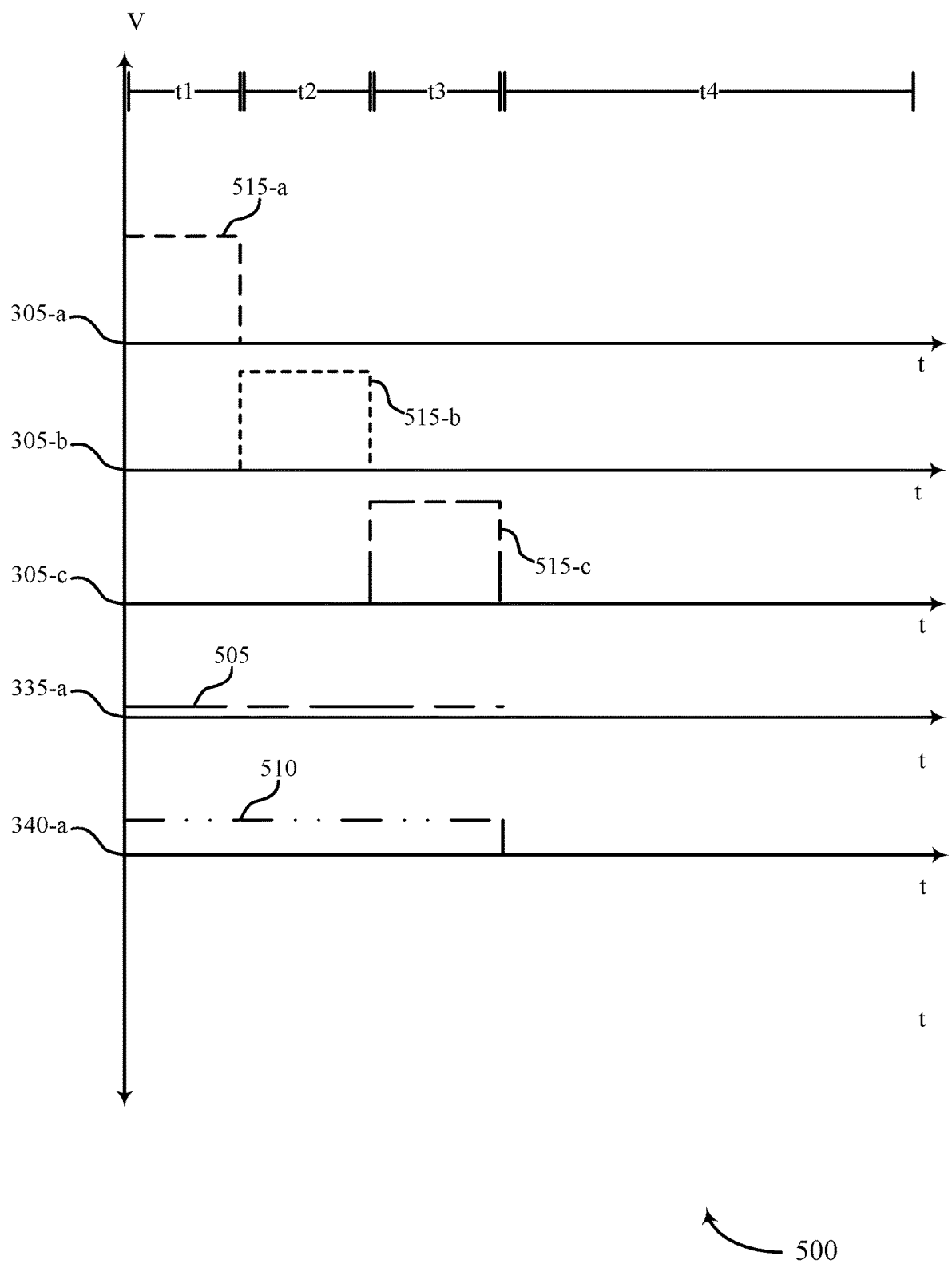
FIG. 5 illustrates an example of a timing diagram that supports cell data bulk reset in accordance with examples as disclosed herein.

FIG. 5 illustrates an example of a timing diagram 500 that supports cell data bulk reset in accordance with examples as disclosed herein. In some examples, the timing diagram 500 may illustrate the voltages of one or more word lines, one or more digit lines, and one or more plate lines during a force write operation. For example, the timing diagram 500 may illustrate a voltage applied to one or more word lines of a first word line group 305-*a*, a second word line group 305-*b*, and a third word line group 305-*c* as described with reference to FIG. 3. Moreover, the timing diagram 500 may illustrate a voltage applied to a digit line 335-*a* and a plate line 340-*a* as described with reference to FIG. 3. The force write operation illustrated by the voltages applied to the word lines, digit line, and plate line may result in a write pulse being applied to the memory cells of the word line groups, which may disturb a logic state written to a subset of the cells. For example, the write pulse may affect the distribution of a subset of memory cells of each word line group upon an associated memory device powering on or powering off.

For exemplary purposes only, the timing diagram 500 may illustrate a force write operation performed on a subset of memory cells that are associated with the first word line group 305-*a*, the second word line group 305-*b*, and the third word line group 305-*c*, and the digit line 335-*a* as described with reference to FIG. 3. However, in other examples, a force write operation may be performed on any subset of memory cells associated with the word line groups 305 or plate groups 350. Moreover, a force write operation may be performed one or more decks of memory cells. In some examples, one or more word lines associated with a word line group 305 or one or more digit lines 335 associated with a plate group 350 may be asserted sequentially or simultaneously, which may write a first logic state to a particular subset of memory cells of a memory array. Thus, although the intervals t1 through t4 illustrate a force write operation performed on a subset of memory cells that are associated with the first word line group 305-*a*, the second word line group 305-*b*, and the third word line group 305-*c*, and the digit line 335-*a* as described with reference to FIG. 3, different subsets of memory cells may undergo a force write operation during the same intervals.

During t1, a voltage 505 (e.g., VSS) may be applied to the digit line 335-*a* and the digit line 335-*b*, and a voltage 510 (e.g., VDD2) may be applied to the plate line 340-*a*. In some instances, the voltage 505 may be applied to the digit lines 335-*a* and 335-*b* during each of the intervals t1 through t3, and the voltage 510 may be applied to the plate line 340-*a* during each of the intervals t1 through t3. That is, the voltage 505 may be continually applied to the digit line 335-*a* through at least the interval t3 and the voltage 510 may be continually applied to the plate line 340-*a* through at least the interval t3. As described herein, either VDD1 or VDD2 may be applied to the plate line 340-*a*. In some instances, the voltage 510 applied to the plate line 340-*a* may be switched during an operation based on an available power supply.

While the voltage 505 is applied to the digit line 335-*a* and the voltage 510 is applied to the plate line 340-*a*, a first write pulse 515-*a* may be applied to the memory cells associated with the first word line group 305-*a*. The first write pulse 515-*a* may be applied by driving the word lines 310-*a* to VDD1 during duration t1. Applying the first write pulse 515-*a* may result in a positive write pulse being applied to the memory cells 345 included in the first word line group 305-*a*. As described herein, the write pulse, which may be associated with a "strong disturb", may affect the distribution of some memory cells 345. In some examples, the distribution of memory cells having previously stored a logic "1" state may shift, which may effectively reset (e.g., erase) the data. In some instances, the pulse applied to the word lines of the word line group 305-*a* may be shorter than a pulse applied to the word lines during a normal write operation.

During t2, a second write pulse 515-*b* may be applied to the memory cells associated with the second word line group 305-*b*. The second write pulse 515-*b* may be applied based on driving the word lines 310-*b* to VDD1. Applying the second write pulse 515-*b* may result in a positive write pulse being applied to the memory cells included in the second word line group 305-*b*. As described herein, the write pulse, which may be associated with a "strong disturb", may affect the distribution of some memory cells included in the second word line group 305-*b*. In some examples, the distribution of memory cells having previously stored a logic "1" state may shift, which may effectively reset (e.g., erase) the data. For example, applying the second write pulse 515-*b* may result in a positive pulse being applied to the memory cell because the plate line 340-*a* may remain driven to a same voltage (e.g., VDD2) and the digit line 335-*a* may remain grounded during t2. In some instances, the pulse applied to the word lines of the word line group 305-*b* may be shorter than a pulse applied to the word lines during a normal write operation.

During t3, a third write pulse 515-*c* may be applied to the memory cells associated with the third word line group 305-*c*. The third write pulse 515-*c* may be applied based on driving the word lines 310-*c* to VDD1. Applying the third write pulse 515-*c* may result in a positive write pulse being applied to the memory cells included in the third word line group 305-*c*. As described herein, the write pulse, which may be associated with a "strong disturb", may affect the distribution of some memory cells included in the third word line group 305-*c*. In some examples, the distribution of memory cells having previously stored a logic "1" state may shift, which may effectively reset (e.g., erase) the data. For example, applying the third write pulse 515-*c* may result in a positive pulse being applied to the memory cell because the plate line 340-*a* may remain driven to a same voltage (e.g., VDD2) and the digit line 335-*a* may remain grounded during t3. In some instances, the pulse applied to the word lines of the word line group 305-*b* may be shorter than a pulse applied to the word lines during a normal write operation.

Upon performing the force write operation on an associated memory cell during t3, the digit line 335-*a* may no longer be driven to VSS and the plate line 340-*a* may no longer be driven to VDD2. That is, the digit line 335-*a* and the plate line 340-*a* may be left floating or driven to another voltage during t4 and subsequent intervals. For example (not shown), during t4 and subsequent intervals, a force write operation may be performed on a subset of memory cells associated with the second plate group 350-b. During such an operation, the digit line 335-c and the digit line 335-d may be driven to VSS and the plate line 340-b may be driven to VDD2 and the word lines associated with one or more word line groups 305 may be asserted as described herein. In some instances, selecting an additional subset of memory cells to perform a force write operation on may be a matter of design choice, and may be determined based on whether a power supply (e.g., VSS, VDD1, or VDD2) is able to drive associated word lines, bit lines, or plate lines to a desired voltage level.

Figure 6:
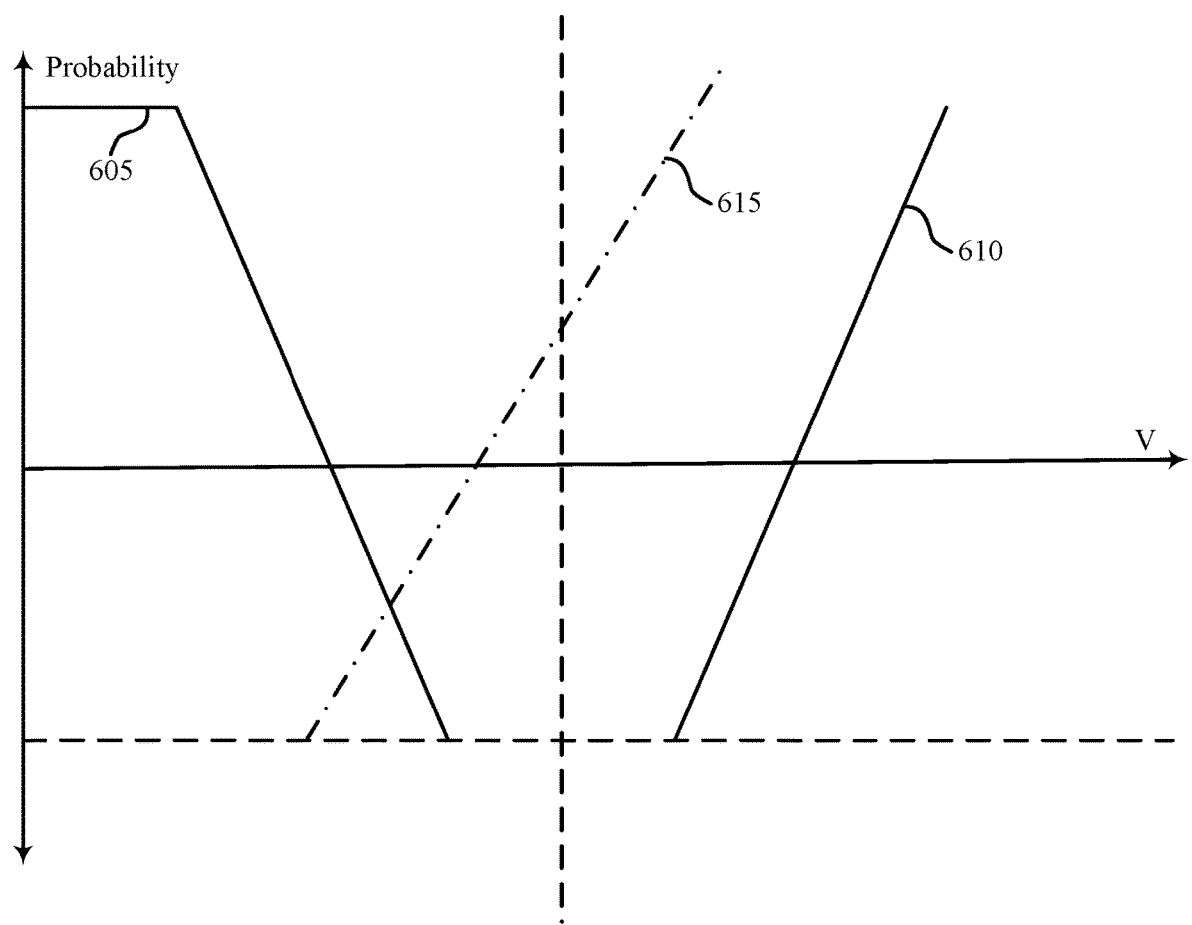
FIG. 6 illustrates an example of a plot that supports cell data bulk reset in accordance with examples as disclosed herein.

FIG. 6 illustrates an example of a plot 600 of a voltage distribution of a memory cell that supports cell data bulk reset in accordance with examples as disclosed herein. In some examples, the plot 600 may illustrate the voltage distribution of a memory cell written to a first logic state and a second logic state (e.g., during a normal write operation). The plot 600 may also illustrate the voltage distribution of the memory cells having undergone a force write operation (e.g., the voltage distribution of memory cells previously written to a logic "1" state and having undergone a force write).

The memory cells having undergone a force write operation may be examples of the memory cells 345 as described with reference to FIG. 3 and the force write operation may be performed as described herein. For example, a force write operation may be performed on a subset of the memory cells 345 associated with each word line group 305 upon the memory device powering on or powering off. Because the memory cells 345 may be non-volatile memory cells and be configured to store data when powered off, performing a bulk reset operation may reduce the likelihood of security threats to data stored by an associated memory device due to sensitive data being present subsequent to a power off event.

A first distribution 605 may represent the distribution of memory cells of an array having been written to a first logic state (e.g., a logic "0") during a write operation (e.g., a normal write operation). As described with reference to FIG. 4, a first logic state may be written to a memory cell by applying a positive write pulse to the respective memory cells. The positive write pulse may be applied by applying a positive voltage (e.g., VMPL) to a plate line and grounding a digit line. While the positive voltage is applied to the plate line and while the digit line is grounded, a word line may be asserted, which may result in a logic "0" being written to the associated memory cell.

A second distribution 610 may represent the distribution of memory cells of an array having been written to a second logic state (e.g., a logic "1") during a write operation (e.g., a normal write operation). As described with reference to FIG. 4, a second logic state may be written to a memory cell by applying a negative write pulse. The negative write pulse may be applied by applying a positive voltage (e.g., VDD) to a digit line and applying a lower voltage (e.g., VSS, a negative voltage) to a plate line. While the positive voltage is applied to the digit line and while the plate line is at the lower voltage, a word line may be asserted, which may result in a logic "1" being written to the associated memory cell.

A third distribution 615 may represent the distribution of a subset of memory cells having undergone a force write operation. As described herein, the force write operation may include applying a strong disturb pulse to the memory cells included in a word line group 305 as described with reference to FIG. 3. The force write operation may be performed on all memory cells of a word line group, however the third distribution 615 may represent the distribution of memory cells having previously stored a logic "1" state. Because the pulse applied to the memory cells during a force write operation may be shorter than a write pulse applied during an access operation (e.g., a normal write operation), and because the voltage of the plate may be VDD2, the memory cells may not fully transition to a logic "0" state. However, the force write operation may affect the distribution of enough memory cells (e.g., enough memory cells having previously been programmed to a logic "1" state) as to create uncertainty of the codeword that is produced during an error correction procedure. Accordingly, applying a strong disturb pulse to the memory cells associated with a word line group 305 to affect the distribution of at least a subset of the memory cells may reduce the likelihood of security threats to data stored by an associated memory device due to sensitive data being present subsequent to a power off event.

Figure 7:
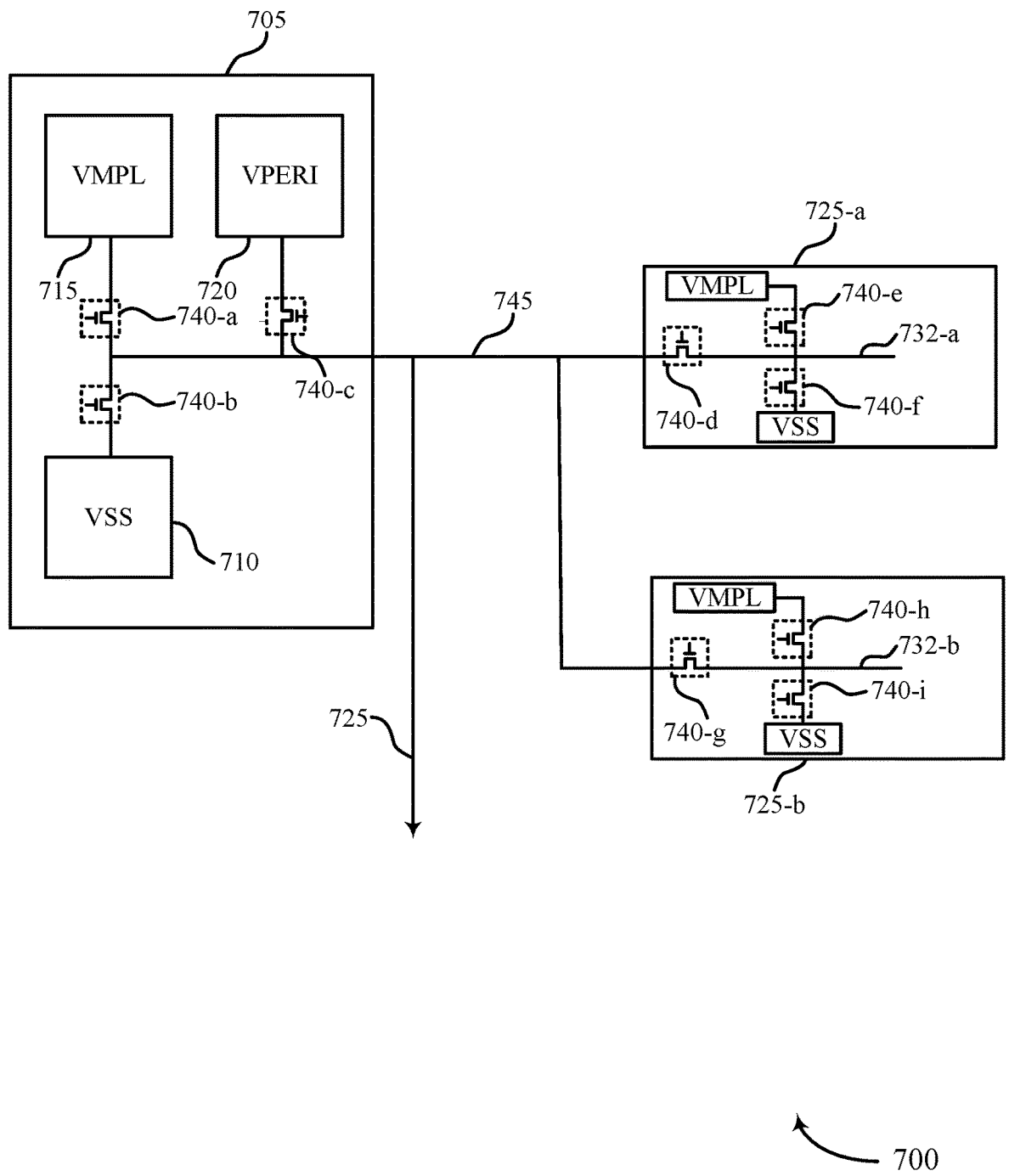
FIG. 7 illustrates an example of a block diagram of a circuit that supports cell data bulk reset in accordance with examples as disclosed herein.

FIG. 7 illustrates an example of a block diagram 700 of a circuit that supports cell data bulk reset in accordance with examples as disclosed herein. The block diagram 700 may illustrate aspects of an array of non-volatile memory cells (e.g., an array of non-volatile memory cells 345 as described with reference to FIG. 3). For example, the block diagram 700 may illustrate a driver 705, a first subset of digit lines 732-a, and a second subset of digit lines 732-b. Each digit line of the first subset of digit lines 732-a and the second subset of digit lines 732-b may have an associated driver 725. For example, drivers 725-a may each drive one of the first subset of digit lines 732-a and drivers 725-b may each drive one of the second subset of digit lines 732-b. In some instances, the first subset of digit lines 732-a may represent all even-numbered digit lines, and the second subset of digit lines 732-b may represent all odd-numbered digit lines. Thus, a single memory array may include a plurality of groups of drivers 725 for digit lines. Moreover, the memory array may include driver 705 for driving a plate line 745, which may be coupled with a first power supply 710 (e.g., VSS), a second power supply 715 (e.g., VMPL), and a third power supply 720 (e.g., VPERI).

The driver 705 illustrated in FIG. 7 may be configured to provide a voltage to plate line 745 and to each subset of digit lines (e.g., via drivers 725). However, in other examples, the first subset of digit lines 732-a and the second subset of digit lines 732-b may each include a respective driver or drivers configured to apply a voltage to the respective subset of digit lines. In either example, the circuit may include one or more transistors 740 that are configured to be activated or deactivated in order for the driver 705 (or a respective digit line driver 725) to drive the plate or different subsets of digit lines to respective voltage values.

In some examples, the driver 705 may be configured to drive the plate line 745, and drivers 725 may couple the plate line 745 to the first subset of digit lines 725-a, the second subset of digit lines 735. In some instances, the drivers 705 and 725 may support a 2-cell per bit architecture. For example, memory cells in different columns (e.g., even columns, odd columns) may be written to complementary states. The associated memory device may include a sense amplifier that is configured to differentially detect a first logic state (e.g., a logic "0") or a second logic state (e.g., a logic "1") of a memory cell.

Moreover, either an access operation (e.g., a write operation) or a force write operation (e.g., a bulk reset operation) may be performed on memory cells based on the driver 705 and drivers 725 driving respective lines to respective voltages. For example, the driver 705 may drive the plate line 745 and the drivers 725 may drive a pattern of digit lines to respective voltages during a force write operation, which may mitigate security risks posed by sensitive data being stored in the memory device subsequent to a power off event. In some instances, the driver 705 and drivers 725 may support a force write operation where a subset (or pattern) of memory cells is programmed to a first logic state (e.g., a logic "0") or a second logic state (e.g., a logic "1").

In some instances, the pattern of digit lines selected for a force write operation may be selected based on various factors. For example, different patterns of digit lines may be selected (e.g., driven) based on hardcoded instructions or may be programmed by a host device (e.g., a host device 105 as described with reference to FIG. 1). In some examples, the force write operation may be performed on each memory cell associated with the digit lines of the first subset of digit lines 732-*a*, the second subset of digit lines 732-*b*, or both. In other examples, a force write operation may be performed on memory cells associated with alternating digit lines (e.g., even digit lines or odd digit lines). In some examples, a first force write operation may be performed on memory cells associated with the first subset of digit lines 732-*a* to write a logic "0," while a second force write operation may be performed on memory cells associated with the second subset of digit lines 732-*b* to write a logic "1," thus performing a bulk reset of bit values for a 2-cell per bit architecture. In each example, the selected pattern may create uncertainty of the codeword that is produced during an error correction procedure, which may effectively reduce the likelihood of security threats to data stored by an associated memory device due to sensitive data being present subsequent to a power off event.

To write a first logic state (e.g., a logic "0") to memory cells associated with the first subset of digit lines 732-*a* or the second subset of digit lines 732-*b*, the driver 725 may be configured to drive the selected pattern of digit lines to a first voltage (e.g., to VSS) and the driver 705 may be configured to drive the plate line 745 to the second voltage (e.g., VMPL) or a third voltage (e.g., VDD2). For example, the drivers 725-*a* may be configured to drive the first subset of digit lines 732-*a* to VSS while the second subset of digit lines 732-*b* is unselected (e.g., driven to the same voltage as plate line 745 via transistors 740-*g*). To drive the plate to VMPL, the transistor 740-*a* may be activated and at least the transistors 740-*b*, 740-*c*, and 740-*d*, may be deactivated. Moreover, to drive the first subset of digit lines 732-*a* to VSS, the transistors 740-*f* may be activated and the transistors 740-*e* may be deactivated. In some instances, the transistors 740-*h* and 740-*i* may be deactivated while the transistor 740-*g* is activated.

While the first subset of digit lines 732-*a* is driven to VSS, a word line driver (not shown) may drive the word lines of a first word line group (e.g., a word line group 305-*a* as described with reference to FIG. 3) to the second voltage, which may write a first logic state (e.g., a logic "0") to the memory cells associated with the first word line group and the second subset of digit lines 732-*a*. A second word line driver (not shown) may drive the word lines of a second word line group (e.g., a word line group 305-*b* as described with reference to FIG. 3) to the second voltage, which may write the first logic state (e.g., a logic "0") to the memory cells associated with the second word line group and the first subset of digit lines 732-*a*. If a force write operation is to be performed on additional memory cells, the driver 705 may support one of two configurations.

In a first configuration, to perform a force write operation on a second subset of memory cells (e.g., memory cells associated with the second subset of digit lines 732-*b*), the driver 705 may apply the first voltage (e.g., VSS) to the plate line 745. To drive the plate line 745 to VSS, the transistor 740-*b* may be activated and at least the transistors 740-*a*, 740-*c*, and 740-*g* may be deactivated. The transistors 740-*h* may be activated to drive the second subset of digit lines 732-*b* to VMPL. While the plate is driven to VSS and the second subset of digit lines 732-*b* are driven to VMPL, the word line driver (not shown) may apply the second voltage (e.g., VDD1) to the word lines of the first word line group, which may write a second logic state (e.g., a logic "1") to the memory cells associated with the first word line group and the second subset of digit lines 732-*b*. A second word line driver (not shown) may drive the word lines of a second word line group (e.g., a word line group 305-*b* as described with reference to FIG. 3) to the second voltage, which may write the second logic state (e.g., a logic "1") to the memory cells associated with the second word line group and the second subset of digit lines 732-*b*.

In a second configuration, to perform a force write operation on a second subset of memory cells, the driver 705 may maintain the plate line 745 at the second voltage (e.g., at VMPL), as well as any additional plates driven to the second voltage, by maintaining the transistor 740-*a* in an active state, and at least the transistors 740-*b*, 740-*c*, and 740-*g* in an inactive (e.g., deactivated) state. The word line driver (not shown) may apply the second voltage (e.g., VMPL, VDD1) to the word lines of the first word line group, which may write a first logic state (e.g., a logic "0") to the memory cells associated with the second word line group and the second subset of digit lines 732-*b*. A second word line driver (not shown) may drive the word lines of a second word line group (e.g., a word line group 305-*b* as described with reference to FIG. 3) to the first voltage, which may write a first logic state (e.g., a logic "0") to the memory cells associated with the second word line group and the second subset of digit lines 732-*b*.

Thus, a force write operation may write a same logic value to cells associated with the first subset of digit lines 732-*a* and the second subset of digit lines 732-*b*, or may write an alternating pattern (e.g., an alternating pattern of logic "0s" or logic "1s") to memory cells associated with the first subset of digit lines 732-*a* and the second subset of digit lines 732-*b*.

In some instances, the transistors 740 may be configured to operate in groups (e.g., first subset of digit lines 732-*a* and second subset of digit lines 732-*b*) or individually based on a control signal (e.g., a control signal initiated by a memory controller 155 or 165 as described with reference to FIG. 1). For example, the transistors 740 may operate in a group where the transistors in every nth column are activated to perform a force write operation in a 00*h*, FFh, AAh, or 55*h* pattern. Additionally or alternatively, the transistors 740 may be configured to operate in groups based on an associated plate group (e.g., a plate group 350-*a*, a plate group 350-*b* as described with reference to FIG. 3). In such an example, the transistors 740 may be activated to perform a force write operation on one or more plate groups. Utilizing a pattern for selecting digit lines during a force write operation may create uncertainty of the codeword that is produced during an error correction procedure, which may effectively reduce the likelihood of security threats to data stored by an associated memory device due to sensitive data being present subsequent to a power off event.

In some examples, a force write operation may be performed on one or more banks of memory cells concurrently or sequentially. For example, a memory array may be divided into banks (e.g., banks of memory cells) and a force write may be performed on one or more of the banks. In a first example, a force write operation may be performed on each bank of a memory array concurrently. As described herein, a force write operation may be performed by driving the digit lines associated with the banks to the first voltage and an associated plate to a second voltage or a third voltage. A word line driver may then drive the word lines associated with the banks to the second voltage, which may write a first logic state (e.g., a logic "0") to the memory cells associated with the banks.

In a second example, one or more banks of memory cells may be grouped together and a force write operation may be performed on a group of banks concurrently. For example, a memory array may include four (4) bank groups and each bank group may include eight (8) banks. A force write operation may be performed on the banks of a single bank group concurrently, and a force write operation performed on different bank groups may be offset in time. That is, a force write operation may be performed on the banks of a first bank group before a force write operation is initiated on the banks of a second bank group. In some instances, a force write operation may be initiated on a second bank group before a force write operation is finished on a first bank group, whereas in other examples a force write operation may be initiated on a second bank group after a force write operation is finished on a first bank group. In either example, performing a force write operation on banks of memory cells or bank groups that each include banks of memory cells may create uncertainty of the codeword that is produced during an error correction procedure, which may effectively reduce the likelihood of security threats to data stored by an associated memory device due to sensitive data being present subsequent to a power off event.

Figure 8:
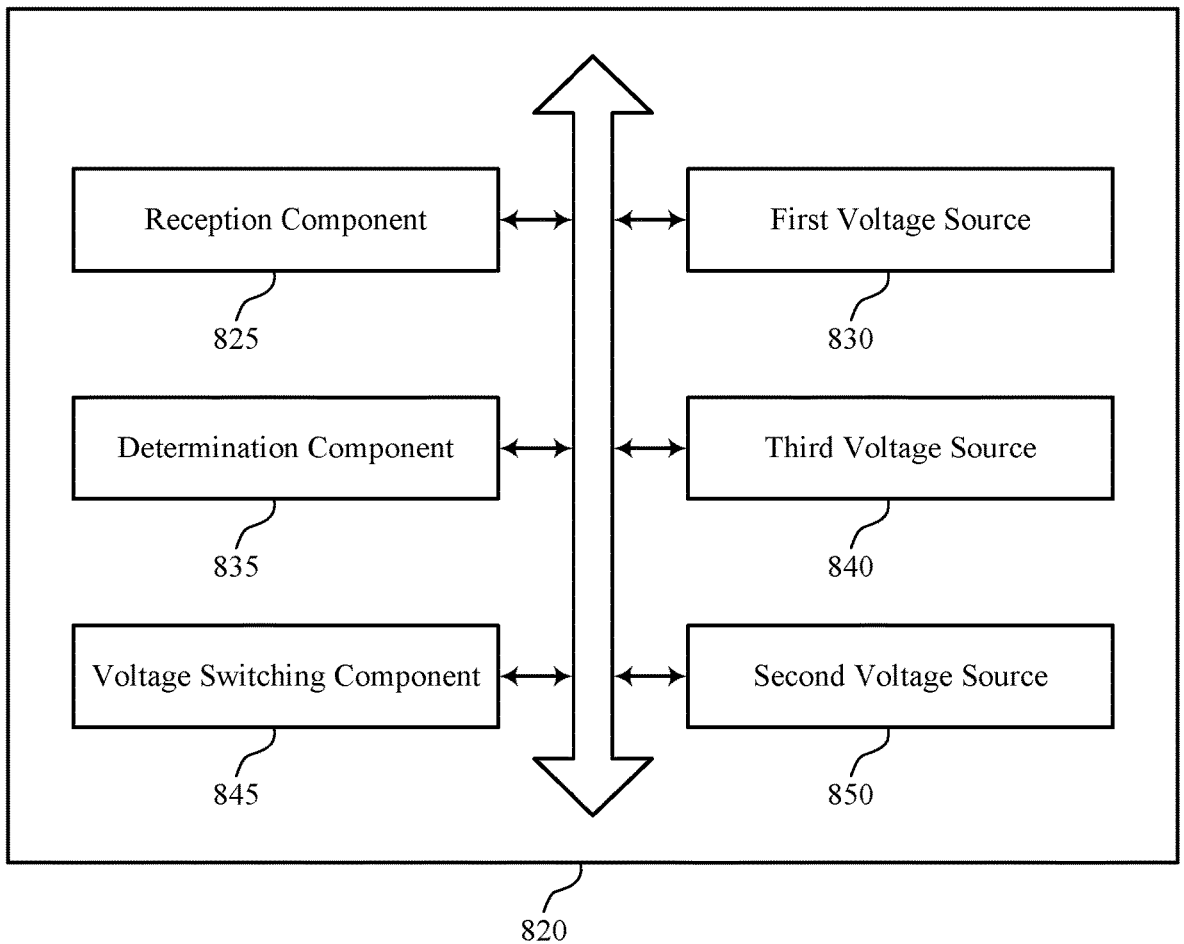
FIG. 8 shows a block diagram of a memory controller that supports cell data bulk reset in accordance with examples as disclosed herein.

FIG. 8 shows a block diagram 800 of a memory controller 820 that supports cell data bulk reset in accordance with examples as disclosed herein. The memory controller 820 may be an example of aspects of a memory controller as described with reference to FIGS. 1 through 7. The memory controller 820, or various components thereof, may be an example of means for performing various aspects of cell data bulk reset as described herein. For example, the memory controller 820 may include a reception component 825, a first voltage source 830, a determination component 835, a third voltage source 840, a voltage switching component 845, a second voltage source 850, or any combination thereof. Each of these components may communicate, directly or indirectly, with one another (e.g., via one or more buses).

The reception component 825 may be configured as or otherwise support a means for receiving a command to write a first memory cell of a plurality of memory cells of a memory device to a first logic state and to write a second memory cell of the plurality of memory cells to a second logic state, where the plurality of memory cells include non-volatile memory cells.

The first voltage source 830 may be configured as or otherwise support a means for applying a first voltage to write the first memory cell to the first logic state and a second voltage to write the second memory cell to the second logic state based at least in part on receiving the command.

The determination component 835 may be configured as or otherwise support a means for determining a transition of the memory device from a first power state to a second power state after writing the first memory cell to the first logic state and the second memory cell to the second logic state. In some examples, the determination component 835 may be configured as or otherwise support a means for determining whether a voltage source associated with supplying the first voltage and the second voltage satisfies a threshold value based at least in part on determining the transition of the memory device from the first power state to the second power state, where applying the third voltage to the first memory cell is based at least in part on determining that the voltage source does not satisfy the threshold value.

The third voltage source 840 may be configured as or otherwise support a means for applying a third voltage to the first memory cell based at least in part on determining the transition of the memory device from the first power state to the second power state, where the third voltage is different than the first voltage and the second voltage.

In some examples, to support applying the third voltage to the first memory cell, the voltage switching component 845 may be configured as or otherwise support a means for switching a voltage supply coupled with a driver of an access line associated with the first memory cell based at least in part on determining that the voltage source does not satisfy the threshold value.

In some examples, applying the second voltage to write the second memory cell to the second logic state includes applying a fourth voltage to an access line associated with the second memory cell. In some examples, applying the third voltage to the first memory cell includes applying a fifth voltage to an access line associated with the first memory cell. In some examples, the fourth voltage is applied to the access line associated with the second memory cell from a first voltage source. In some examples, the fifth voltage is applied to the access line associated with the first memory cell from a second voltage source different than the first voltage source.

In some examples, applying the first voltage to write the first memory cell to the first logic state includes applying a fourth voltage to a plate associated with the plurality of memory cells and applying the second voltage to write the second memory cell to the second logic state includes applying a fifth voltage to the plate. In some examples, applying the third voltage to the first memory cell includes applying a sixth voltage to the plate. In some examples, the first power state or the second power state corresponds to a powered-off state.

Figure 9:
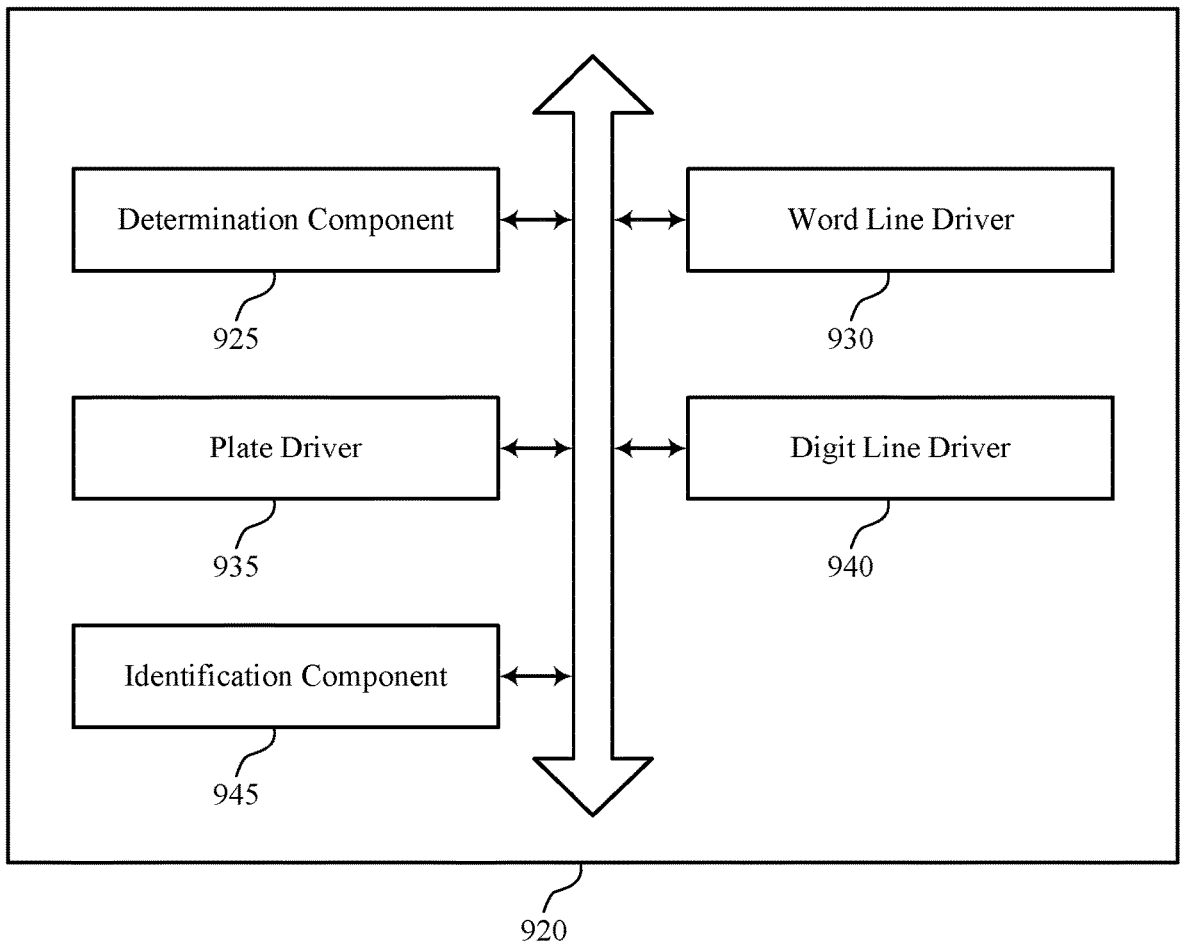
FIG. 9 shows a block diagram of a memory controller that supports cell data bulk reset in accordance with examples as disclosed herein.

FIG. 9 shows a block diagram 900 of a memory controller 920 that supports cell data bulk reset in accordance with examples as disclosed herein. The memory controller 920 may be an example of aspects of a memory controller as described with reference to FIGS. 1 through 7. The memory controller 920, or various components thereof, may be an example of means for performing various aspects of cell data bulk reset as described herein. For example, the memory controller 920 may include a determination component 925, a word line driver 930, a plate driver 935, a digit line driver 940, an identification component 945, or any combination thereof. Each of these components may communicate, directly or indirectly, with one another (e.g., via one or more buses).

The determination component 925 may be configured as or otherwise support a means for determining a transition of a memory device including a plurality of memory cells from a first power state to a second power state, where the plurality of memory cells are non-volatile memory cells.

The word line driver 930 may be configured as or otherwise support a means for driving a first subset of word lines of the memory device to a first voltage based at least in part on determining the transition of the memory device from the first power state to the second power state.

In some examples, the word line driver 930 may be configured as or otherwise support a means for driving a second subset of word lines of the memory device to the first voltage after the first logic state is written to the first subset of the plurality of memory cells and while the first subset of digit lines is driven to the third voltage, where the first logic state is written to a second subset of the plurality of memory cells based at least in part on driving the second subset of word lines to the first voltage. In some examples, the word line driver 930 may be configured as or otherwise support a means for driving the first subset of word lines of the memory device to a fourth voltage after the first logic state is written to the first subset of the plurality of memory cells, where driving the second subset of word lines of the memory device to the first voltage is based at least in part on driving the first subset of word lines of the memory device to the fourth voltage.

The plate driver 935 may be configured as or otherwise support a means for driving a first plate of the memory device to a second voltage. In some examples, the plate driver 935 may be configured as or otherwise support a means for driving the first plate of the memory device to the third voltage after the first logic state is written to the first subset of the plurality of memory cells and while the first subset of word lines of the memory device is driven to the first voltage. In some examples, the plate driver 935 may be configured as or otherwise support a means for driving a second plate of the memory device to the second voltage.

In some examples, the plate driver 935 may be configured as or otherwise support a means for maintaining driving the first plate of the memory device to the second voltage while driving the first subset of word lines of the memory device to the fourth voltage.

The digit line driver 940 may be configured as or otherwise support a means for driving a first subset of digit lines of the memory device to a third voltage and a second subset of digit lines of the memory device to the second voltage based at least in part on driving the first subset of word lines to the first voltage and driving the first plate to the second voltage, where a first subset of the plurality of memory cells are written to a first logic state based at least in part on driving the first subset of word lines to the first voltage, the first plate to the second voltage, and the first subset of digit lines to the third voltage. In some examples, the digit line driver 940 may be configured as or otherwise support a means for maintaining driving the first subset of digit lines of the memory device to the third voltage and the second subset of digit lines of the memory device to the second voltage while the plate is driven to the third voltage.

In some examples, the digit line driver 940 may be configured as or otherwise support a means for driving a third subset of digit lines of the memory device to the third voltage while the second plate is driven to the second voltage, where a second subset of the plurality of memory cells are written to the first logic state based at least in part on driving the first subset of word lines to the first voltage, driving the second plate to the second voltage, and driving the third subset of digit lines to the third voltage.

In some examples, the identification component 945 may be configured as or otherwise support a means for identifying a pattern of memory cells for writing to the first logic state. In some examples, the identification component 945 may be configured as or otherwise support a means for identifying the first subset of digit lines based at least in part on identifying the pattern of memory cells for writing the first logic state, where the first subset of digit lines is driven to the third voltage based at least in part on identifying the first subset of digit lines.

Figure 10:
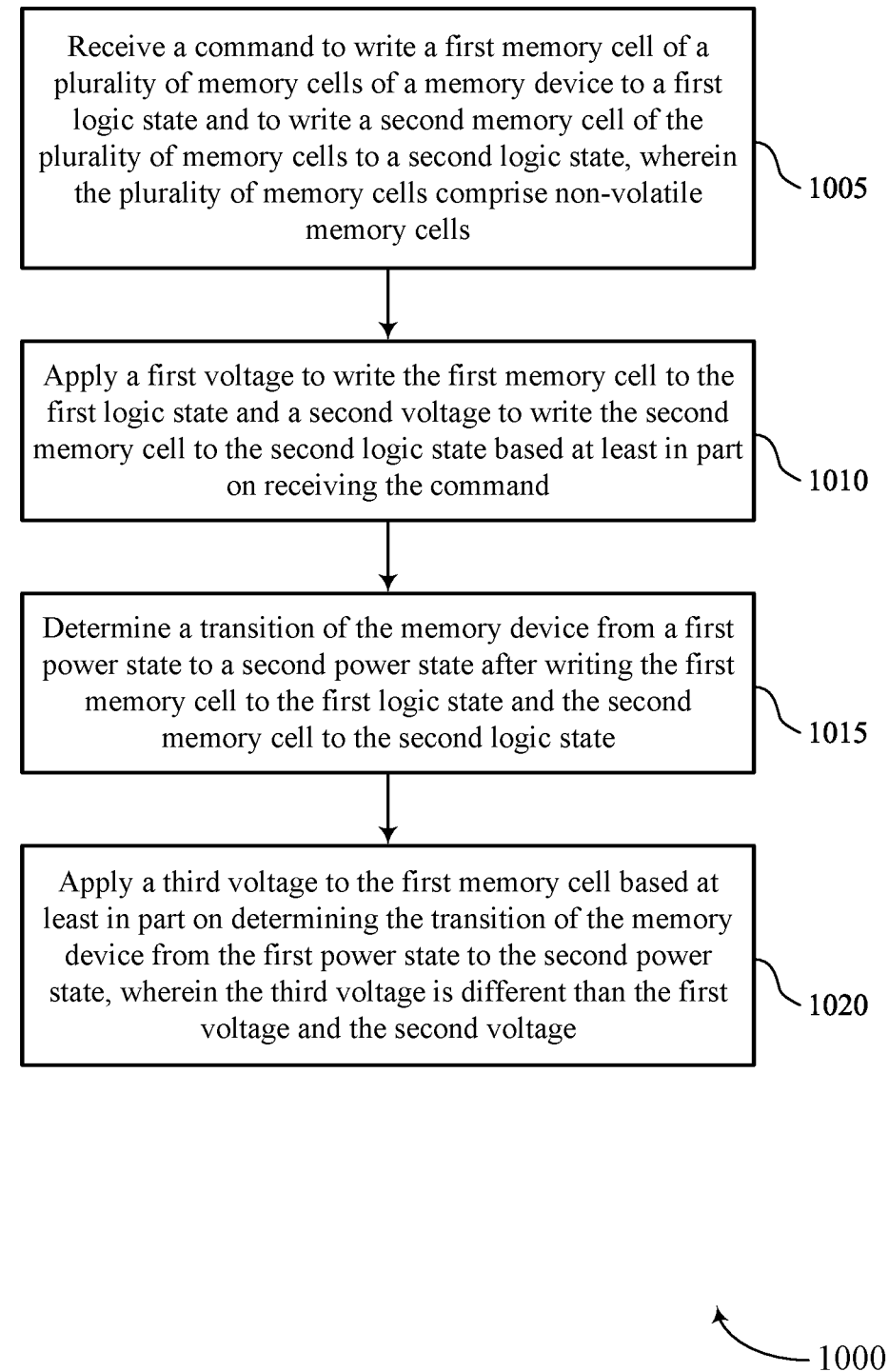
FIGS. 10 and 11 show flowcharts illustrating a method or methods that support cell data bulk reset in accordance with examples as disclosed herein.

FIG. 10 shows a flowchart illustrating a method 1000 that supports cell data bulk reset in accordance with examples as disclosed herein. The operations of method 1000 may be implemented by a memory controller or its components as described herein. For example, the operations of method 1000 may be performed by a memory controller as described with reference to FIGS. 1 through 8. In some examples, a memory controller may execute a set of instructions to control the functional elements of the device to perform the described functions. Additionally or alternatively, the memory controller may perform aspects of the described functions using special-purpose hardware.

At 1005, the method may include receiving a command to write a first memory cell of a plurality of memory cells of a memory device to a first logic state and to write a second memory cell of the plurality of memory cells to a second logic state, where the plurality of memory cells include non-volatile memory cells. The operations of 1005 may be performed in accordance with examples as disclosed herein. In some examples, aspects of the operations of 1005 may be performed by a reception component 825 as described with reference to FIG. 8.

At 1010, the method may include applying a first voltage to write the first memory cell to the first logic state and a second voltage to write the second memory cell to the second logic state based at least in part on receiving the command. The operations of 1010 may be performed in accordance with examples as disclosed herein. In some examples, aspects of the operations of 1010 may be performed by a first voltage source 830 as described with reference to FIG. 8.

At 1015, the method may include determining a transition of the memory device from a first power state to a second power state after writing the first memory cell to the first logic state and the second memory cell to the second logic state. The operations of 1015 may be performed in accordance with examples as disclosed herein. In some examples, aspects of the operations of 1015 may be performed by a determination component 835 as described with reference to FIG. 8.

At 1020, the method may include applying a third voltage to the first memory cell based at least in part on determining the transition of the memory device from the first power state to the second power state, where the third voltage is different than the first voltage and the second voltage. The operations of 1020 may be performed in accordance with examples as disclosed herein. In some examples, aspects of the operations of 1020 may be performed by a third voltage source 840 as described with reference to FIG. 8.

In some examples, an apparatus as described herein may perform a method or methods, such as the method 1000. The apparatus may include, features, circuitry, logic, means, or instructions (e.g., a non-transitory computer-readable medium storing instructions executable by a processor) for receiving a command to write a first memory cell of a plurality of memory cells of a memory device to a first logic state and to write a second memory cell of the plurality of memory cells to a second logic state, where the plurality of memory cells include non-volatile memory cells, applying a first voltage to write the first memory cell to the first logic state and a second voltage to write the second memory cell to the second logic state based at least in part on receiving the command, determining a transition of the memory device from a first power state to a second power state after writing the first memory cell to the first logic state and the second memory cell to the second logic state, and applying a third voltage to the first memory cell based at least in part on determining the transition of the memory device from the first power state to the second power state, where the third voltage is different than the first voltage and the second voltage.

Some examples of the method 1000 and the apparatus described herein may further include operations, features, circuitry, logic, means, or instructions for determining whether a voltage source associated with supplying the first voltage and the second voltage satisfies a threshold value based at least in part on determining the transition of the memory device from the first power state to the second power state, where applying the third voltage to the first memory cell may be based at least in part on determining that the voltage source does not satisfy the threshold value.

In some examples of the method 1000 and the apparatus described herein, applying the third voltage to the first memory cell may include operations, features, circuitry, logic, means, or instructions for switching a voltage supply coupled with a driver of an access line associated with the first memory cell based at least in part on determining that the voltage source does not satisfy the threshold value.

Some examples of the method 1000 and the apparatus described herein may further include operations, features, circuitry, logic, means, or instructions for applying the second voltage to write the second memory cell to the second logic state includes applying a fourth voltage to an access line associated with the second memory cell, and applying the third voltage to the first memory cell includes applying a fifth voltage to an access line associated with the first memory cell.

In some examples of the method 1000 and the apparatus described herein, the fourth voltage may be applied to the access line associated with the second memory cell from a first voltage source and the fifth voltage may be applied to the access line associated with the first memory cell from a second voltage source different than the first voltage source.

Some examples of the method 1000 and the apparatus described herein may further include operations, features, circuitry, logic, means, or instructions for applying the first voltage to write the first memory cell to the first logic state includes applying a fourth voltage to a plate associated with the plurality of memory cells and applying the second voltage to write the second memory cell to the second logic state includes applying a fifth voltage to the plate and applying the third voltage to the first memory cell includes applying a sixth voltage to the plate.

In some examples of the method 1000 and the apparatus described herein, the first power state or the second power state corresponds to a powered-off state.

Figure 11:
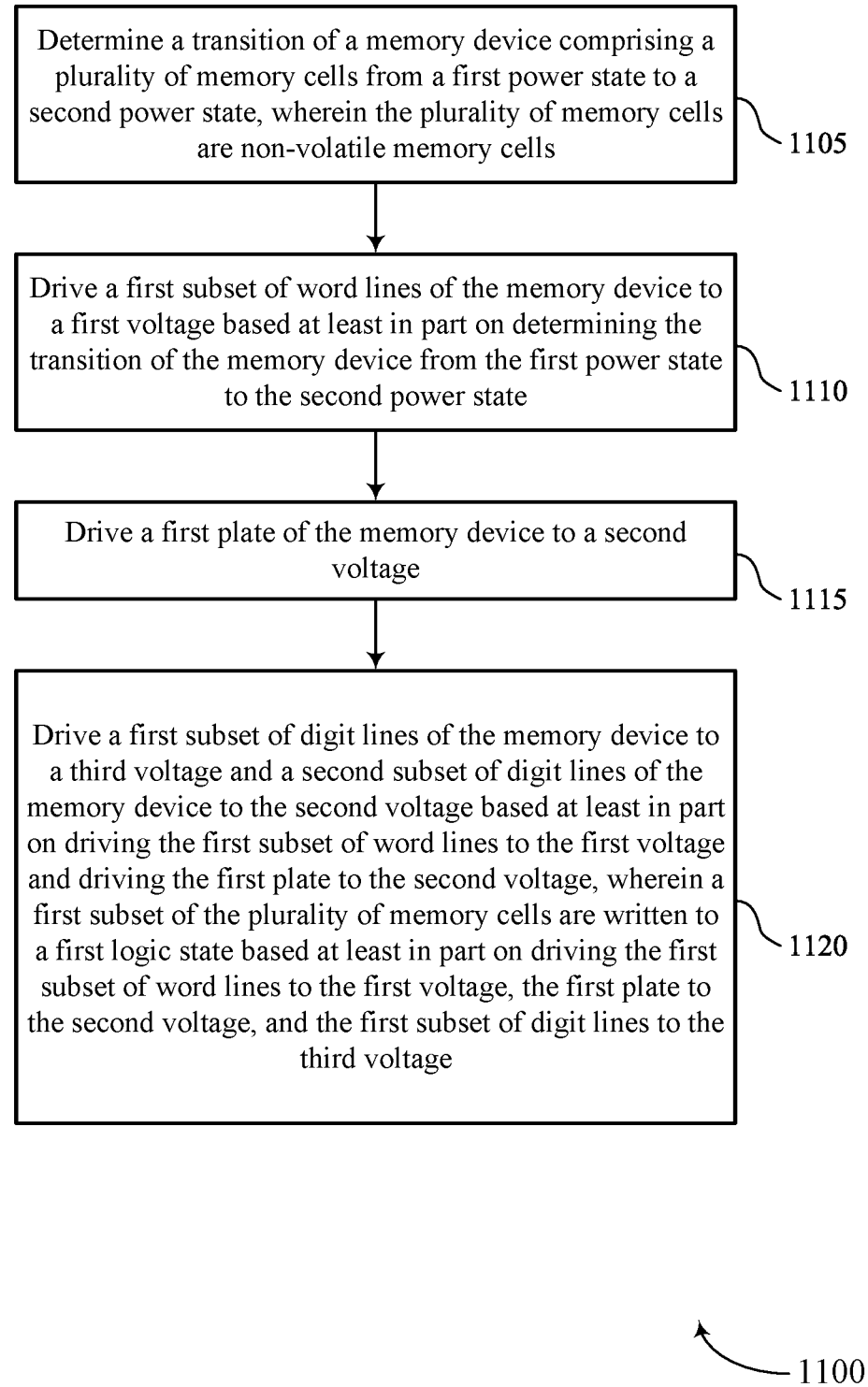

FIG. 11 shows a flowchart illustrating a method 1100 that supports cell data bulk reset in accordance with examples as disclosed herein. The operations of method 1100 may be implemented by a memory controller or its components as described herein. For example, the operations of method 1100 may be performed by a memory controller as described with reference to FIGS. 1 through 7 and 9. In some examples, a memory controller may execute a set of instructions to control the functional elements of the device to perform the described functions. Additionally or alternatively, the memory controller may perform aspects of the described functions using special-purpose hardware.

At 1105, the method may include determining a transition of a memory device including a plurality of memory cells from a first power state to a second power state, where the plurality of memory cells are non-volatile memory cells. The operations of 1105 may be performed in accordance with examples as disclosed herein. In some examples, aspects of the operations of 1105 may be performed by a determination component 925 as described with reference to FIG. 9.

At 1110, the method may include driving a first subset of word lines of the memory device to a first voltage based at least in part on determining the transition of the memory device from the first power state to the second power state. The operations of 1110 may be performed in accordance with examples as disclosed herein. In some examples, aspects of the operations of 1110 may be performed by a word line driver 930 as described with reference to FIG. 9.

At 1115, the method may include driving a first plate of the memory device to a second voltage. The operations of 1115 may be performed in accordance with examples as disclosed herein. In some examples, aspects of the operations of 1115 may be performed by a plate driver 935 as described with reference to FIG. 9.

At 1120, the method may include driving a first subset of digit lines of the memory device to a third voltage and a second subset of digit lines of the memory device to the second voltage based at least in part on driving the first subset of word lines to the first voltage and driving the first plate to the second voltage, where a first subset of the plurality of memory cells are written to a first logic state based at least in part on driving the first subset of word lines to the first voltage, the first plate to the second voltage, and the first subset of digit lines to the third voltage. The operations of 1120 may be performed in accordance with examples as disclosed herein. In some examples, aspects of the operations of 1120 may be performed by a digit line driver 940 as described with reference to FIG. 9.

In some examples, an apparatus as described herein may perform a method or methods, such as the method 1100. The apparatus may include, features, circuitry, logic, means, or instructions (e.g., a non-transitory computer-readable medium storing instructions executable by a processor) for determining a transition of a memory device including a plurality of memory cells from a first power state to a second power state, where the plurality of memory cells are non-volatile memory cells, driving a first subset of word lines of the memory device to a first voltage based at least in part on determining the transition of the memory device from the first power state to the second power state, driving a first plate of the memory device to a second voltage, and driving a first subset of digit lines of the memory device to a third voltage and a second subset of digit lines of the memory device to the second voltage based at least in part on driving the first subset of word lines to the first voltage and driving the first plate to the second voltage, where a first subset of the plurality of memory cells are written to a first logic state based at least in part on driving the first subset of word lines to the first voltage, the first plate to the second voltage, and the first subset of digit lines to the third voltage.

Some examples of the method 1100 and the apparatus described herein may further include operations, features, circuitry, logic, means, or instructions for driving the first plate of the memory device to the third voltage after the first logic state may be written to the first subset of the plurality of memory cells and while the first subset of word lines of the memory device may be driven to the first voltage and maintaining driving the first subset of digit lines of the memory device to the third voltage and the second subset of digit lines of the memory device to the second voltage while the plate may be driven to the third voltage.

Some examples of the method 1100 and the apparatus described herein may further include operations, features, circuitry, logic, means, or instructions for driving a second plate of the memory device to the second voltage and driving a third subset of digit lines of the memory device to the third voltage while the second plate may be driven to the second voltage, where a second subset of the plurality of memory cells may be written to the first logic state based at least in part on driving the first subset of word lines to the first voltage, driving the second plate to the second voltage, and driving the third subset of digit lines to the third voltage.

Some examples of the method 1100 and the apparatus described herein may further include operations, features, circuitry, logic, means, or instructions for identifying a pattern of memory cells for writing to the first logic state and identifying the first subset of digit lines based at least in part on identifying the pattern of memory cells for writing the first logic state, where the first subset of digit lines may be driven to the third voltage based at least in part on identifying the first subset of digit lines.

Some examples of the method 1100 and the apparatus described herein may further include operations, features, circuitry, logic, means, or instructions for driving a second subset of word lines of the memory device to the first voltage after the first logic state may be written to the first subset of the plurality of memory cells and while the first subset of digit lines may be driven to the third voltage, where the first logic state may be written to a second subset of the plurality of memory cells based at least in part on driving the second subset of word lines to the first voltage.

Some examples of the method 1100 and the apparatus described herein may further include operations, features, circuitry, logic, means, or instructions for driving the first subset of word lines of the memory device to a fourth voltage after the first logic state may be written to the first subset of the plurality of memory cells, where driving the second subset of word lines of the memory device to the first voltage may be based at least in part on driving the first subset of word lines of the memory device to the fourth voltage.

Some examples of the method 1100 and the apparatus described herein may further include operations, features, circuitry, logic, means, or instructions for maintaining driving the first plate of the memory device to the second voltage while driving the first subset of word lines of the memory device to the fourth voltage.

It should be noted that the methods described herein are possible implementations, and that the operations and the steps may be rearranged or otherwise modified and that other implementations are possible. Furthermore, portions from two or more of the methods may be combined.

Another apparatus is described. The apparatus may include a memory array including a plurality of non-volatile memory cells, a controller coupled with the memory array, the controller operable to, receive a command to write a first memory cell of the plurality of non-volatile memory cells to a first logic state and to write a second memory cell of the plurality of non-volatile memory cells to a second logic state, apply a first voltage to write the first memory cell to the first logic state and a second voltage to write the second memory cell to the second logic state based at least in part on receiving the command, determine a transition of the memory array from a first power state to a second power state after writing the first memory cell to the first logic state and the second memory cell to the second logic state, and apply a third voltage to the first memory cell based at least in part on determining the transition of the memory array from the first power state to the second power state, where the third voltage is different than the first voltage and the second voltage.

In some examples, the apparatus may include determine whether a voltage source associated with supplying the first voltage and the second voltage satisfies a threshold value based at least in part on determining the transition of the memory array from the first power state to the second power state, where applying the third voltage to the first memory cell may be based at least in part on determining that the voltage source does not satisfy the threshold value.

In some examples, the apparatus may include switch a voltage supply coupled with a driver of an access line associated with the first memory cell based at least in part on determining that the voltage source does not satisfy the threshold value.

In some examples of the apparatus, to apply the second voltage to write the second memory cell to the second logic state, the controller may be operable to apply a fourth voltage to an access line associated with the second memory cell and to apply the third voltage to the first memory cell, the controller may be operable to apply a fifth voltage to an access line associated with the first memory cell.

In some examples of the apparatus, the fourth voltage may be applied to the access line associated with the second memory cell from a first voltage source and the fifth voltage may be applied to the access line associated with the first memory cell from a second voltage source different than the first voltage source.

In some examples, the apparatus may include receive a second command to transition from the first power state to the second power state.

In some examples of the apparatus, the first power state or the second power state corresponds to a powered-off state.

Another apparatus is described. The apparatus may include a memory array including a plurality of memory cells, where the plurality of memory cells include non-volatile memory cells, a controller coupled with the memory array, the controller operable to, determine a transition of the memory array from a first power state to a second power state, drive a first subset of word lines of the memory array to a first voltage based at least in part on determining the transition of the memory array from the first power state to the second power state, drive a first plate of the memory array to a second voltage, and drive a first subset of digit lines of the memory array to a third voltage and a second subset of digit lines of the memory array to the second voltage based at least in part on driving the first subset of word lines to the first voltage and driving the first plate to the second voltage, where a first subset of the plurality of memory cells are written to a first logic state based at least in part on driving the first subset of word lines to the first voltage, the first plate to the second voltage, and the first subset of digit lines to the third voltage.

In some examples, the apparatus may include drive the first plate of the memory array to the third voltage after the first logic state may be written to the first subset of the plurality of memory cells and while the first subset of word lines of the memory array may be driven to the first voltage and maintain driving the first subset of digit lines of the memory array to the third voltage and the second subset of digit lines of the memory array to the second voltage while the plate may be driven to the third voltage.

In some examples of the apparatus, a first memory cell associated with one of the first subset of digit lines and a second memory cell associated with one of the second subset of digit lines may be associated with a single bit of data.

In some examples of the apparatus, to drive the first subset of digit lines to the third voltage, the controller may be operable to enable respective first switching devices coupled between the first subset of digit lines and a first node and to drive the second subset of digit lines to the second voltage, the controller may be operable to enable respective second switching devices coupled between the second subset of digit lines and a second node.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
receiving a command to write a first memory cell of a plurality of memory cells of a memory device to a first logic state and to write a second memory cell of the plurality of memory cells to a second logic state, wherein the plurality of memory cells comprise non-volatile memory cells;
applying a first voltage to write the first memory cell to the first logic state and a second voltage to write the second memory cell to the second logic state based at least in part on receiving the command;
determining a transition of the memory device from a first power state to a second power state after writing the first memory cell to the first logic state and the second memory cell to the second logic state; and
applying a third voltage to write the first memory cell to the second logic state based at least in part on determining the transition of the memory device from the first power state to the second power state, wherein the third voltage is different than the first voltage and the second voltage.

2. The method of claim 1, further comprising:
determining whether a voltage source associated with supplying the first voltage and the second voltage satisfies a threshold value based at least in part on determining the transition of the memory device from the first power state to the second power state, wherein applying the third voltage to the first memory cell is based at least in part on determining that the voltage source does not satisfy the threshold value.

3. The method of claim 2, wherein applying the third voltage to the first memory cell comprises:
switching a voltage supply coupled with a driver of an access line associated with the first memory cell based at least in part on determining that the voltage source does not satisfy the threshold value.

4. The method of claim 1, wherein:
applying the second voltage to write the second memory cell to the second logic state comprises applying a fourth voltage to an access line associated with the second memory cell, and
applying the third voltage to the first memory cell comprises applying a fifth voltage to an access line associated with the first memory cell.

5. The method of claim 4, wherein:
the fourth voltage is applied to the access line associated with the second memory cell from a first voltage source; and
the fifth voltage is applied to the access line associated with the first memory cell from a second voltage source different than the first voltage source.

6. The method of claim 1, wherein:
applying the first voltage to write the first memory cell to the first logic state comprises applying a fourth voltage to a plate associated with the plurality of memory cells and applying the second voltage to write the second memory cell to the second logic state comprises applying a fifth voltage to the plate; and
applying the third voltage to the first memory cell comprises applying a sixth voltage to the plate.

7. The method of claim 1, wherein the first power state or the second power state corresponds to a powered-off state.

8. A method, comprising:
- determining a transition of a memory device comprising a plurality of memory cells from a first power state to a second power state, wherein the plurality of memory cells are non-volatile memory cells;
- driving a first subset of word lines of the memory device to a first voltage based at least in part on determining the transition of the memory device from the first power state to the second power state;
- driving a first plate of the memory device to a second voltage; and
- driving a first subset of digit lines of the memory device to a third voltage and a second subset of digit lines of the memory device to the second voltage based at least in part on driving the first subset of word lines to the first voltage and driving the first plate to the second voltage, wherein a first subset of the plurality of memory cells are written to a first logic state based at least in part on driving the first subset of word lines to the first voltage, the first plate to the second voltage, and the first subset of digit lines to the third voltage.

9. The method of claim 8, further comprising:
- driving the first plate of the memory device to the third voltage after the first logic state is written to the first subset of the plurality of memory cells and while the first subset of word lines of the memory device is driven to the first voltage; and
- maintaining driving the first subset of digit lines of the memory device to the third voltage and the second subset of digit lines of the memory device to the second voltage while the first plate is driven to the third voltage.

10. The method of claim 8, further comprising:
- driving a second plate of the memory device to the second voltage; and
- driving a third subset of digit lines of the memory device to the third voltage while the second plate is driven to the second voltage, wherein a second subset of the plurality of memory cells are written to the first logic state based at least in part on driving the first subset of word lines to the first voltage, driving the second plate to the second voltage, and driving the third subset of digit lines to the third voltage.

11. The method of claim 8, further comprising:
- identifying a pattern of memory cells for writing to the first logic state; and
- identifying the first subset of digit lines based at least in part on identifying the pattern of memory cells for writing the first logic state, wherein the first subset of digit lines is driven to the third voltage based at least in part on identifying the first subset of digit lines.

12. The method of claim 8, further comprising:
- driving a second subset of word lines of the memory device to the first voltage after the first logic state is written to the first subset of the plurality of memory cells and while the first subset of digit lines is driven to the third voltage, wherein the first logic state is written to a second subset of the plurality of memory cells based at least in part on driving the second subset of word lines to the first voltage.

13. The method of claim 12, further comprising:
- driving the first subset of word lines of the memory device to a fourth voltage after the first logic state is written to the first subset of the plurality of memory cells, wherein driving the second subset of word lines of the memory device to the first voltage is based at least in part on driving the first subset of word lines of the memory device to the fourth voltage.

14. The method of claim 13, further comprising:
- maintaining driving the first plate of the memory device to the second voltage while driving the first subset of word lines of the memory device to the fourth voltage.

15. An apparatus, comprising:
- a memory array comprising a plurality of non-volatile memory cells; and
- a controller coupled with the memory array, the controller operable to:
  - receive a command to write a first memory cell of the plurality of non-volatile memory cells to a first logic state and to write a second memory cell of the plurality of non-volatile memory cells to a second logic state;
  - apply a first voltage to write the first memory cell to the first logic state and a second voltage to write the second memory cell to the second logic state based at least in part on receiving the command;
  - determine a transition of the memory array from a first power state to a second power state after writing the first memory cell to the first logic state and the second memory cell to the second logic state; and
  - apply a third voltage to write the first memory cell to the second logic state based at least in part on determining the transition of the memory array from the first power state to the second power state, wherein the third voltage is different than the first voltage and the second voltage.

16. The apparatus of claim 15, wherein the controller is operable to:
- determine whether a voltage source associated with supplying the first voltage and the second voltage satisfies a threshold value based at least in part on determining the transition of the memory array from the first power state to the second power state, wherein applying the third voltage to the first memory cell is based at least in part on determining that the voltage source does not satisfy the threshold value.

17. The apparatus of claim 16, wherein, to apply the third voltage to the first memory cell, the controller is operable to:
- switch a voltage supply coupled with a driver of an access line associated with the first memory cell based at least in part on determining that the voltage source does not satisfy the threshold value.

18. The apparatus of claim 15, wherein:
- to apply the second voltage to write the second memory cell to the second logic state, the controller is operable to apply a fourth voltage to an access line associated with the second memory cell; and
- to apply the third voltage to the first memory cell, the controller is operable to apply a fifth voltage to an access line associated with the first memory cell.

19. The apparatus of claim 18, wherein:
- the fourth voltage is applied to the access line associated with the second memory cell from a first voltage source; and
- the fifth voltage is applied to the access line associated with the first memory cell from a second voltage source different than the first voltage source.

20. The apparatus of claim 15, wherein, to determine the transition of the memory array from the first power state to the second power state the controller is operable to:
- receive a second command to transition from the first power state to the second power state.

21. The apparatus of claim 15, wherein the first power state or the second power state corresponds to a powered-off state.

22. An apparatus, comprising:
- a memory array comprising a plurality of memory cells, wherein the plurality of memory cells comprise non-volatile memory cells; and
- a controller coupled with the memory array, the controller operable to:
  - determine a transition of the memory array from a first power state to a second power state;
  - drive a first subset of word lines of the memory array to a first voltage based at least in part on determining the transition of the memory array from the first power state to the second power state;
  - drive a first plate of the memory array to a second voltage; and
  - drive a first subset of digit lines of the memory array to a third voltage and a second subset of digit lines of the memory array to the second voltage based at least in part on driving the first subset of word lines to the first voltage and driving the first plate to the second voltage, wherein a first subset of the plurality of memory cells are written to a first logic state based at least in part on driving the first subset of word lines to the first voltage and the first plate to the second voltage, and wherein a second subset of the plurality of memory cells are written to a second logic state based at least in part on driving the second subset of digit lines to the third voltage.

23. The apparatus of claim 22, wherein the controller is operable to:
- drive the first plate of the memory array to the third voltage after the first logic state is written to the first subset of the plurality of memory cells and while the first subset of word lines of the memory array is driven to the first voltage; and
- maintain driving the first subset of digit lines of the memory array to the third voltage and the second subset of digit lines of the memory array to the second voltage while the first plate is driven to the third voltage.

24. The apparatus of claim 23, wherein a first memory cell associated with one of the first subset of digit lines and a second memory cell associated with one of the second subset of digit lines are associated with a single bit of data.

25. The apparatus of claim 22, wherein:
- to drive the first subset of digit lines to the third voltage, the controller is operable to enable respective first switching devices coupled between the first subset of digit lines and a first node; and
- to drive the second subset of digit lines to the second voltage, the controller is operable to enable respective second switching devices coupled between the second subset of digit lines and a second node.

* * * * *